United States Patent
Persson et al.

(10) Patent No.: US 7,420,416 B2
(45) Date of Patent: Sep. 2, 2008

(54) TUNABLE PREDISTORTER

(75) Inventors: Gunnar Persson, Spånga (SE); Gerlach Spee, Ösmo (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 11/663,341

(22) PCT Filed: Sep. 20, 2005

(86) PCT No.: PCT/SE2005/001381

§ 371 (c)(1),
(2), (4) Date: Mar. 21, 2007

(87) PCT Pub. No.: WO2006/033622

PCT Pub. Date: Mar. 30, 2006

(65) Prior Publication Data

US 2008/0018398 A1    Jan. 24, 2008

(30) Foreign Application Priority Data

Sep. 21, 2004  (SE) ................................ 0402289
Oct. 15, 2004  (SE) ................................ 0402524

(51) Int. Cl.
*H03F 1/26*    (2006.01)
(52) U.S. Cl. .................................... 330/149; 375/297
(58) Field of Classification Search ............... 330/149, 330/53, 286, 287; 375/296, 297
See application file for complete search history.

(56) References Cited

U.S. PATENT DOCUMENTS 4,588,959 A    5/1986  Herzog et al.
5,146,177 A    9/1992  Katz et al.
6,018,266 A *  1/2000  Wu ............................. 330/149
6,028,477 A *  2/2000  Gentzler ..................... 330/149
6,326,843 B1 * 12/2001  Nygren et al. .............. 330/149

FOREIGN PATENT DOCUMENTS

FR    2696295 A1    4/1994

OTHER PUBLICATIONS

International Search Report for PCT/SE2005/001381 mailed Dec. 5, 2005.

* cited by examiner

*Primary Examiner*—Henry K Choe
(74) *Attorney, Agent, or Firm*—Nixon & Vanderhye, P.C.

(57) ABSTRACT

The present invention relates to an analog predistorter (100) having a tunable amplitude (60) and/or phase (80) expansion. The predistorter (100) includes a coupler (110) having an input port (112), an output port (114), a first (116) and a second (118) coupled port separated by 90 degrees. A first compensation circuit (120A) is connected to the first coupled port (116) and comprises a first combination (130A) of linear (132A) and nonlinear (131A) circuit elements and a first impedance adjusting unit (140A) for adjusting the impedance seen by the nonlinear circuit element (131A). A second compensation circuit (120B) is connected to the second coupled port (118) and comprises a second combination (130B) of linear (132B) and nonlinear (131B) circuit elements a second impedance adjusting unit (140B) for adjusting the impedance seen by said nonlinear circuit element (131B). By adjusting the impedances seen by the nonlinear circuit elements (13 IA, 131B) the amplitude (60) and/or phase (80) expansion of the predisorter (100) are tuned.

24 Claims, 15 Drawing Sheets

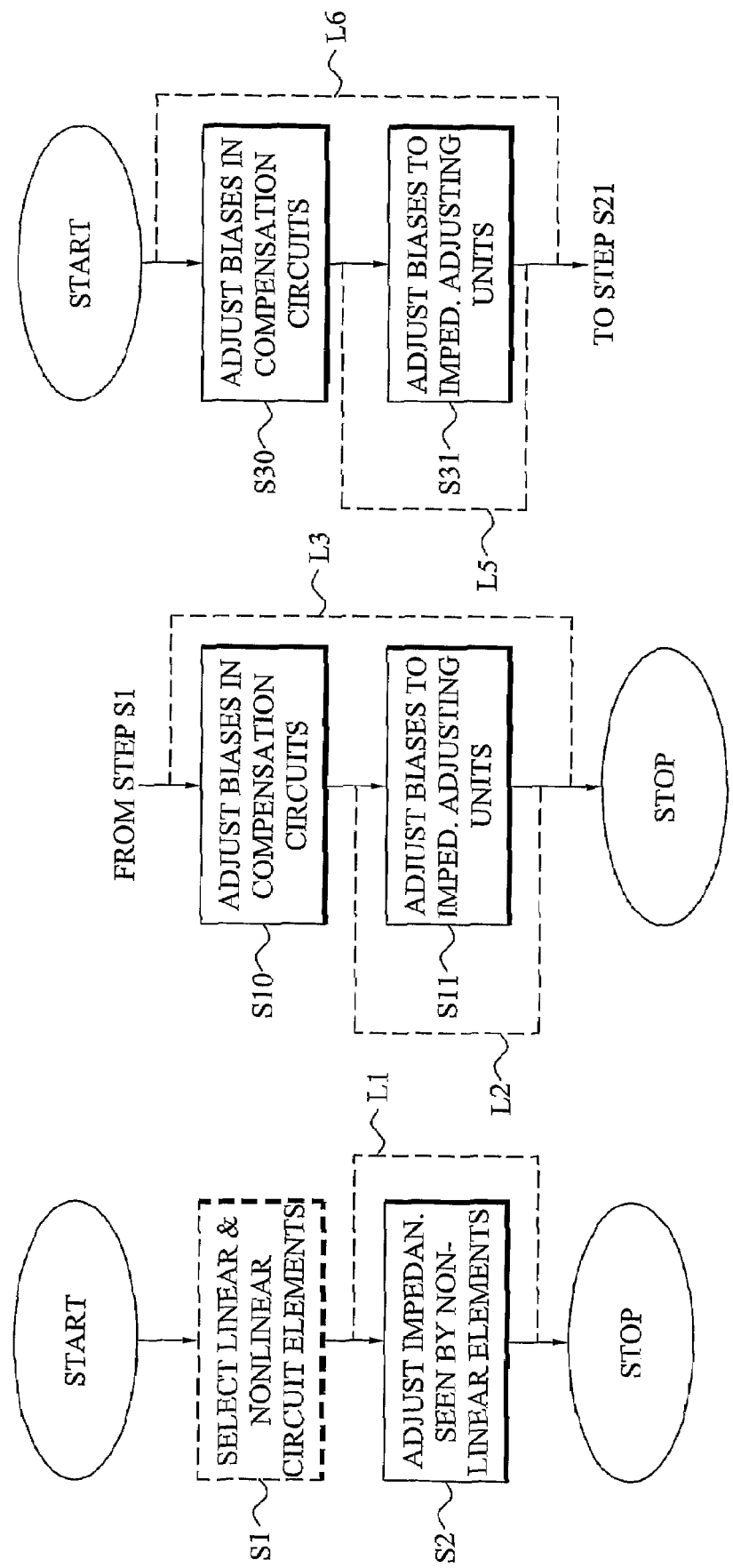

TUNABLE PREDISTORTER

This application is the U.S. national phase of international application PCT/SE2005/001381 filed 20 Sep. 2005 which designated the U.S. and claims benefit of SE 0402289-3, filed 21 Sep. 2004 and SE 0402524-3 filed 15 Oct. 2004, the entire content of which is hereby incorporated by reference.

TECHNICAL FIELD

The present invention generally relates to predistorters, and in particular to analog predistorters with tunable complex gain expansion.

BACKGROUND

Amplifiers are used today in a wide range of applications for amplifying different signals. In for example radio communications systems a power amplifier typically amplifies a radio frequency (RF) signal in a transmitter prior to transmission to a receiver.

One basic problem in power amplifiers is when they are operated at or close to their saturation levels. At such high power demand levels (close to the saturation power limit of the amplifiers), amplifiers may experience drastic changes in amplitude and phase characteristics, increasing the intermodulation (IM) distortion. In addition, amplifiers in radio communications systems are often required to simultaneously amplify several different carrier signals. As a result, nonlinear intermodulation products are generated which may interfere with the processing of the transmitted signals.

FIGS. 1A and 1B schematically illustrate the amplitude (gain) and phase transfer characteristics of a typical power amplifier at different (input) power levels, respectively. As is seen in the diagrams, the transfer characteristics consist of a linear part 50; 70 followed at high drive levels (over the nonlinear power point $P_S$) by a nonlinear portion 60; 80 or complex gain (amplitude gain or phase) compression. This nonlinear amplifier behavior can, thus, be decreased by reducing the power output of the amplifier. However, such power output reduction reduces the signal levels and transmission efficiency.

As a consequence, the signals provided to the amplifier are preferably processed to alter them to account for the nonlinear (intermodulation) effects. An example of such a signal processing is the predistortion technique. In this technique, the signal provided to the amplifier is altered by generating a compensation characteristic that is the opposite to the transfer characteristics of the amplifier, illustrated in FIGS. 1A and 1B, in both amplitude and phase, and this altered signal is provided to the amplifier. As a consequence, the linear operation portion 50; 70 is preferably extended into higher power levels and the intermodulation products are removed or at least reduced.

The patent document U.S. Pat. No. 6,326,843 discloses an analog reflective predistorter employed for compensating for phase and amplitude variations imposed on an input signal by one or more nonlinear transfer characteristics of a power amplifier operating at or near saturation. This predistorter includes a hybrid having signal input and output terminals and two relative phase terminals separated by 90 degrees. A respective compensation circuit is connected to each of the terminals. Such a compensation circuit includes a Schottky diode pair in parallel with a pair of resistances and a capacitance. A respective bias network is coupled to the input and output terminals of the hybrid for setting bias levels so that the compensation characteristics of the compensation circuit are started or initiated at the nonlinear behavior point ($P_S$ in FIGS. 1A and 1B) of the amplifier. In addition, the value of the capacitance in the compensation circuit and the length of the line between the diode pair and resistances determine the phase expansion of the predistorter. The amplitude predistortion of the predistorter is determined by the value of the resistances.

SUMMARY

Although the phase and amplitude predistortion of a prior art predistorter can be selected by careful choice of the components in the compensating circuit, as described in the patent document U.S. Pat. No. 6,326,843 once such a component selection has been performed, the phase and amplitude predistortion is fixed and cannot be adjusted further. There is, thus, a need for a tunable predistorter having a tunable complex gain expansion.

The present invention overcomes these and other drawbacks of the prior art arrangements.

It is a general object of the present invention to provide a tunable predistorter.

It is another object of the invention to provide a predistorter with tunable complex gain expansion.

It is a particular object of an embodiment of the invention is to provide an analog predistorter with tunable amplitude gain and/or phase expansion.

These and other objects are met by the invention as defined by the accompanying patent claims.

Briefly, the present invention involves an analog predistorter that has tunable phase and/or gain expansion. This is solved by the invention by providing a predistorter having a coupler with its input port adapted for receiving an input signal, e.g. an input RF signal, and an output port adapted for outputting a predistorted output signal. In addition, a respective compensation circuit is connected to each of two coupled ports of the coupler. These compensation circuits generally include a combination of linear and nonlinear circuit elements, provided as parallel and/or series connection of linear and nonlinear circuit elements. In a particular embodiment, the nonlinear element is preferably represented by one or multiple parallel connected diodes, preferably Schottky diodes, or transistors. The linear element is preferably represented by one or at least two parallel connected resistances.

A respective impedance varying unit is connected to the compensation circuits of the predistorter. These impedance varying units are provided for varying the load impedance seen by the nonlinear circuit elements, e.g. Schottky diodes, of the compensation circuits, which in turn will control and tune the phase and/or amplitude gain expansion of the predistorter. Depending on the actual impedance adjustment (increase or decrease), the phase (amplitude) expansion of the predistorter can be adjusted independently of the amplitude (phase) expansion. In addition, also a combined phase and amplitude gain expansion tuning is possible through the impedance adjustment.

In a particular embodiment of the invention, the impedance varying unit can be implemented as a circuit element or circuitry having a varying or adjustable reactance or capacitance, preferably an electrically adjustable reactance or capacitance. An example of such a circuit element that can be used according to the present invention is a varicap diode, preferably an electrically biased varicap diode.

In order to adjust this phase and/or amplitude expansion of the predistorter, the biases experienced by the varicap diodes are changed. The bias changes in turn adjust the capacitance of the diodes, which affect the load impedance seen by the nonlinear circuit elements. As a consequence of this load impedance changes the phase and/or amplitude expansions of the predistorter is changed.

The predistorter can also in particular embodiments include a respective bias circuit for providing a variable bias to the compensation circuits and the nonlinear circuit elements of the compensation circuits. In such a case, the power level at which the nonlinear complex gain expansion of the predistorter is initiated can also be adjusted. This embodiment provides an extra degree of freedom since both the initiation power point of the nonlinear compensation characteristic and the actual shape of the nonlinear compensation characteristic of the predistorter can be adjusted.

In particular embodiments of the invention that utilize multiple nonlinear circuit elements, multiple impedance varying units can be implemented per compensation circuit. For example, each Schottky diode of a diode pair can be connected to and having its experienced load impedance controlled by a respective impedance varying unit.

The invention offers the following advantages:
Enables independent and/or combined adjustment of the amplitude gain and phase expansion of a predistorter without an exchange of the including circuit elements;
Can electrically tune the amplitude and/or phase expansion of a predisorter;
Allows independent improvement of amplitude and phase saturation behavior of a predistorted amplifier, which provides a better relation between output power and intermodulation;
Provides an extra degree of freedom in adjusting a predistorter and, thus, in linearizing a nonlinear transfer characteristic; and
Can be realized by a cheap and simple circuitry solution.

Other advantages offered by the present invention will be appreciated upon reading of the below description of the embodiments of the invention.

SHORT DESCRIPTION OF THE DRAWINGS

The invention together with further objects and advantages thereof, may best be understood by making reference to the following description taken together with the accompanying drawings, in which:

FIG. 14 is a flow diagram illustrating a method of tuning a predistorter according to the present invention;

FIG. 15 is a flow diagram illustrating an embodiment of the impedance-adjusting step FIG. 14 in more detail;

FIG. 17 is a flow diagram illustrating additional steps of the compensating method of FIG. 16.

DETAILED DESCRIPTION

Figure 1A:
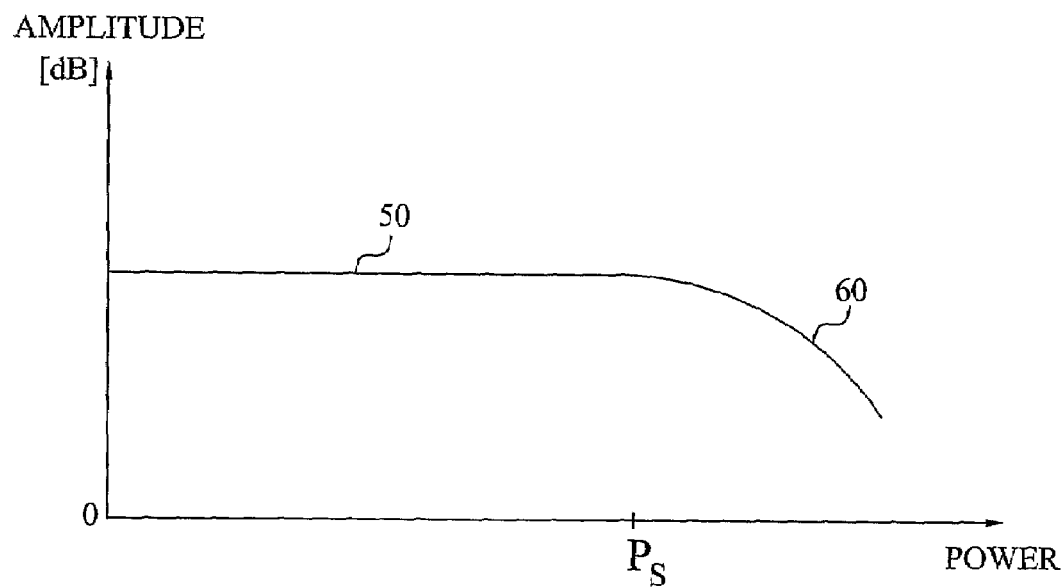
FIG. 1A is a diagram schematically illustrating the amplitude gain transfer characteristics of a power amplifier at different power levels.

Throughout the drawings, the same reference characters will be used for corresponding or similar elements.

The present invention relates to a predistorter having an adjustable compensation transfer characteristic or predistortion. According to the invention, the amplitude gain and/or phase expansion, denoted complex gain expansion herein, of the predistorter can be adjusted or tuned during operation without an exchange of the components included in the predistorter. This tunability of the operation characteristics of the predistorter allows (independent) improvement of the amplitude and phase saturation behavior of an amplifier or other circuitry with nonlinear transfer characteristic compensated or predistorted according to the invention. This in turn provides a better relation between the output power of the amplifier and the intermodulation.

Figure 2A:
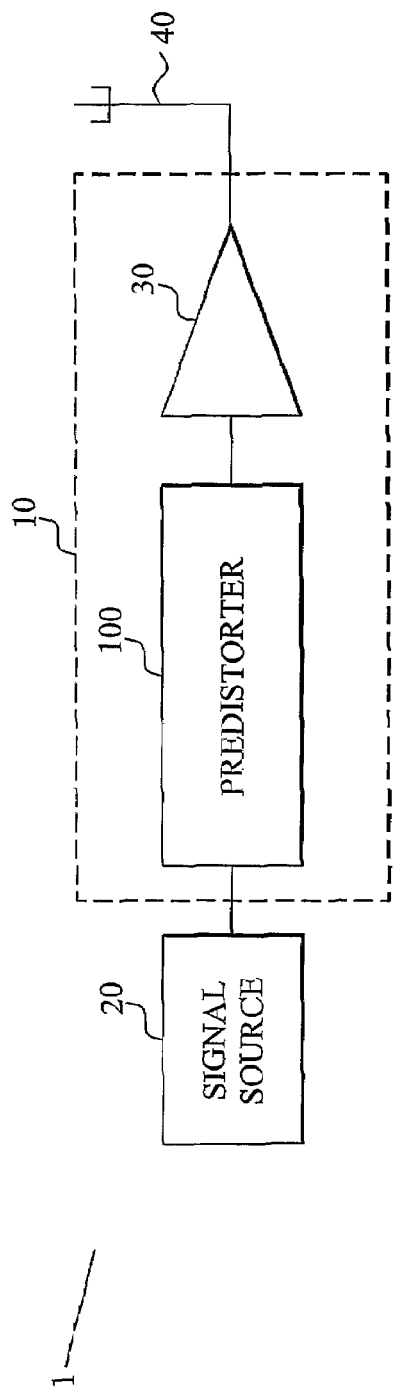
FIG. 2A is a schematic block diagram of an embodiment of a radio communications unit according to the invention.

FIG. 2A schematically illustrates a portion of a radio communications unit or transmitter 1 comprising a signal processing unit 10 with a predistorter 100 according to the invention. The transmitter 1 includes a signal source 20 that provides signals, e.g. RF signals, to an amplifier 30 of the signal processing unit 10. The signal output of the amplifier 30 is provided to an antenna 40 for transmission to a receiver. A predistorter or linearizer 100 according to the invention is provided in the processing unit 10, preferably positioned between the signal source 20 and the amplifier 30 so that the output signal of the signal source 20 passes through the predistorter 100 prior reaching the amplifier 30. The tunable predistorter 100 can then predistort the amplifier input signal to compensate for the amplitude and/or phase nonlinearities of the amplifier 30. In addition, by allowing a combined adjustment of the phase and amplitude expansion of the predistorter 100, the predistorter 100 will compensate for changes in the operation characteristics of the amplifier 100.

It is anticipated by the present invention that the amplifier 30 of the processing unit 10 can be exchanged by another circuit element or circuitry with nonlinear transfer characteristics that can cause phase and/or amplitude variations in a signal. In addition, the processing unit 10 and the signal source 20 could be arranged in another terminal than a transmitter 1. Then, the predistorted and amplified signal from the processing unit 10 is forwarded to some other unit or circuitry than an antenna 40.

Figure 2B:
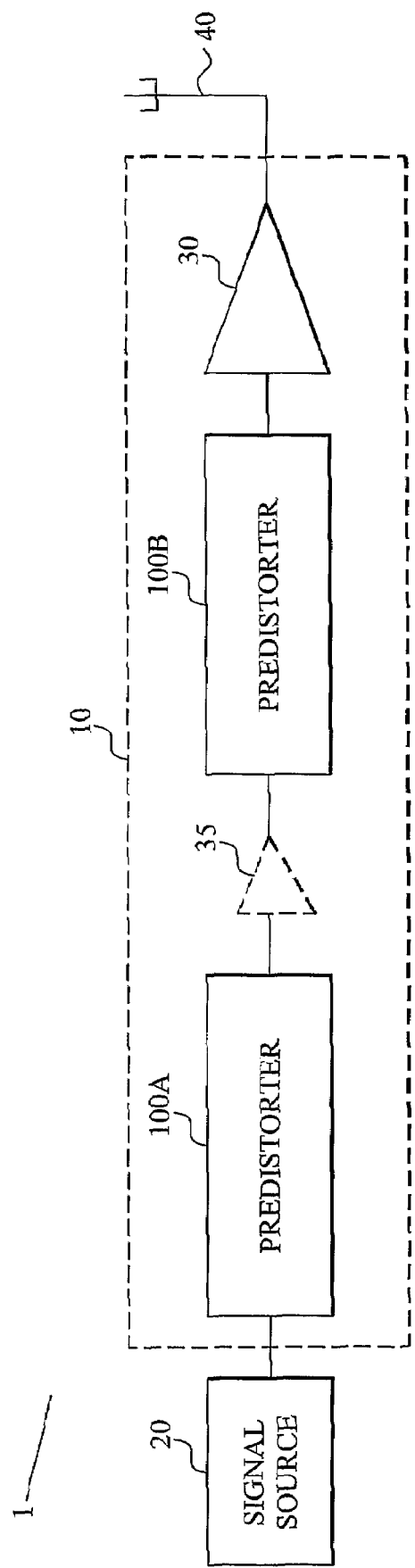
FIG. 2B is a schematic block diagram of another embodiment of a radio communications unit according to the invention.

FIG. 2B schematically illustrates another embodiment of a radio communications unit or transmitter 1 according to the invention. In this embodiment, two predistorters 100A, 100B according to the invention has been positioned between the signal source 20 and the amplifier 30. An optional buffer amplifier 35 can be arranged between the predistorters 100A, 100B. In this embodiment, one of the predistorters 100A, 100B has a tunable or adjustable amplitude gain expansion, whereas the other predistorter then preferably has a tunable phase expansion. Thus, the predistorters 100A, 100B can in this embodiment independently adjust the phase and amplitude gain expansion, preferably the phase and amplitude expansion shape.

The transmitter 1 disclosed in FIGS. 2A and 2B can of course include additional units in the signal line from the signal source 20 to the antenna 40. For example, the signal processing unit 10 can be feed-forward connected to further suppress any intermodulation effects.

The transmitter 1 according to the present invention can be arranged in any type of (radio) communication unit including stationary units such as base stations and mobile units such as mobile telephones, mobile terminals and mobile communicators.

Figure 1B:
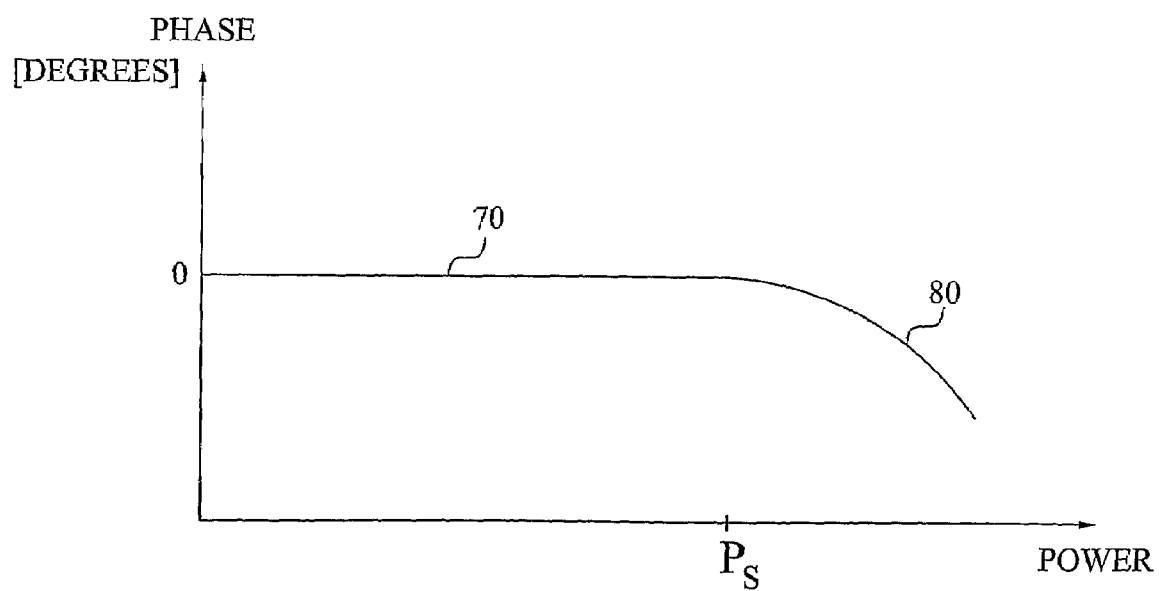
FIG. 1B is a diagram schematically illustrating the phase transfer characteristics of a power amplifier at different power levels.
Figure 3A:
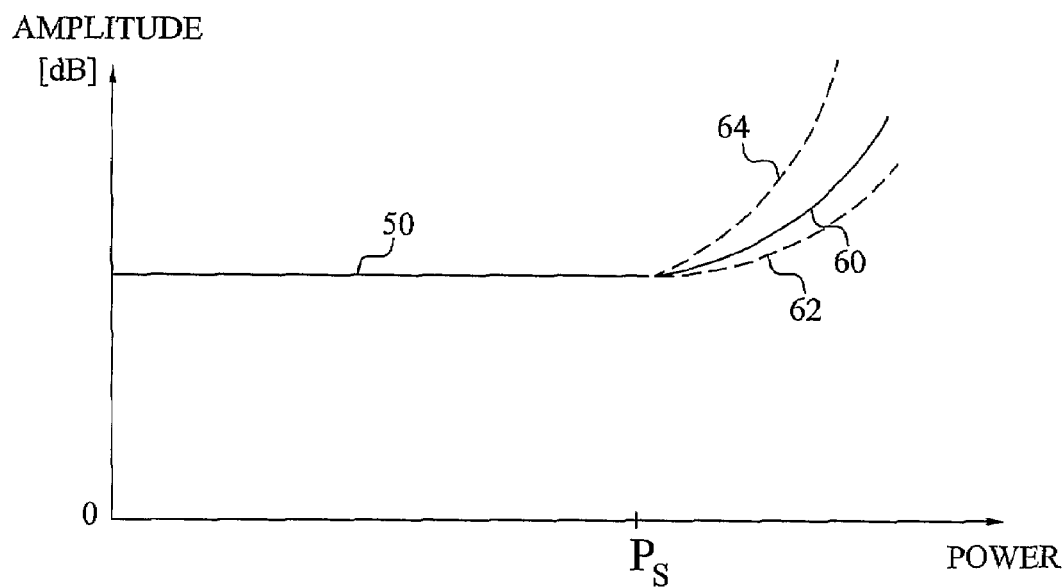
FIG. 3A is a diagram schematically illustrating the tunable amplitude gain transfer characteristics of a predistorter according to the invention at different power levels.
Figure 3B:
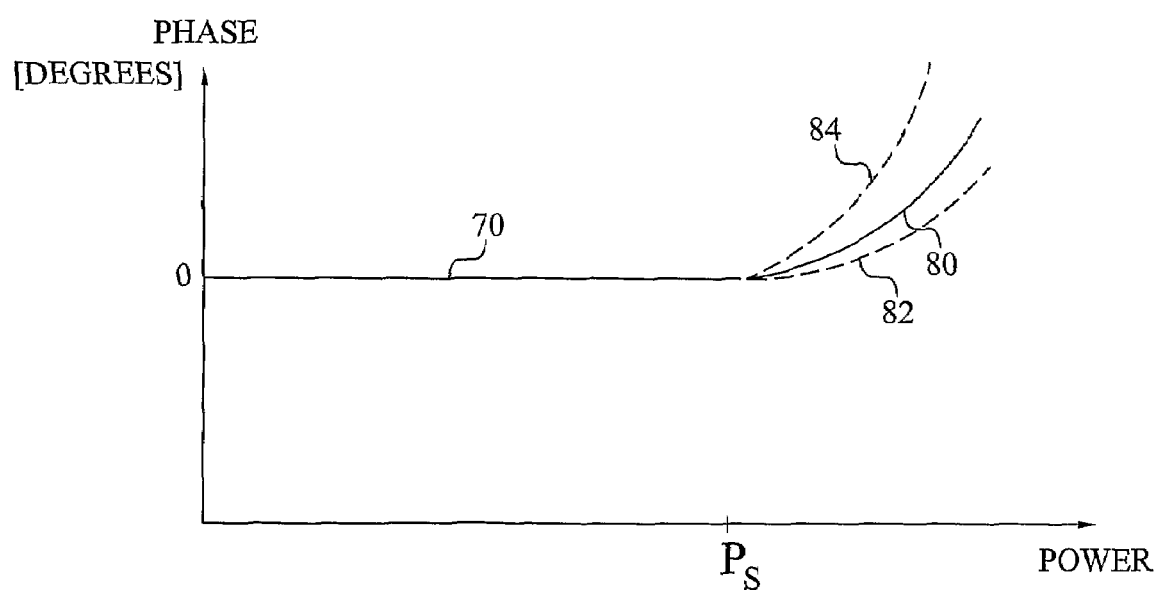
FIG. 3B is a diagram schematically illustrating the tunable phase transfer characteristics of a predistorter according to the invention at different power levels.

FIGS. 3A and 3B are diagrams illustrating the transfer or compensation characteristics of a predistorter according to the present invention. As can been seen by comparing these figures with FIGS. 1A and 1B, it is evident that the compensation characteristics of the predistorter optimally should be the inverse of the corresponding transfer characteristics of the amplifier (or other circuitry) that the predistorter is to linearize. Thus, the compensation characteristics typically include a linear part 50; 70 followed at relative high power levels (above $P_S$ in the figures) by a nonlinear or expansion part 60; 80. The tunability of the complex gain expansion, i.e. the amplitude gain 60 and/or phase 80 expansion, according to the invention give rise to a family of (amplitude/phase) characteristics or curves 60-64; 80-84 as schematically illustrated in FIGS. 3A and 3B. Thus, the phase and amplitude expansion (corresponding to the nonlinear portions of the transfer characteristics) can be adjusted around an initial or basic phase and amplitude expansion 60; 80. Thus, the adjustability of the predistorter of the invention allows the phase and amplitude expansion to reach values between the minimum 62; 82 and maximum expansion curves 64; 84. The initial amplitude and phase expansions 60; 80 are set or defined by the choice of including components in the predistorter, which is discussed in more detail below. The present invention, thus, allows adjustment of the actual behavior in the nonlinear part or the relationship between the predistorter phase and/or amplitude and the power level in the nonlinear part. This basically corresponds to changing the sloping or shape of the nonlinear part of the transfer characteristics in FIGS. 3A and 3B or rotating the nonlinear portion at the nonlinear behavior point.

Figure 4:
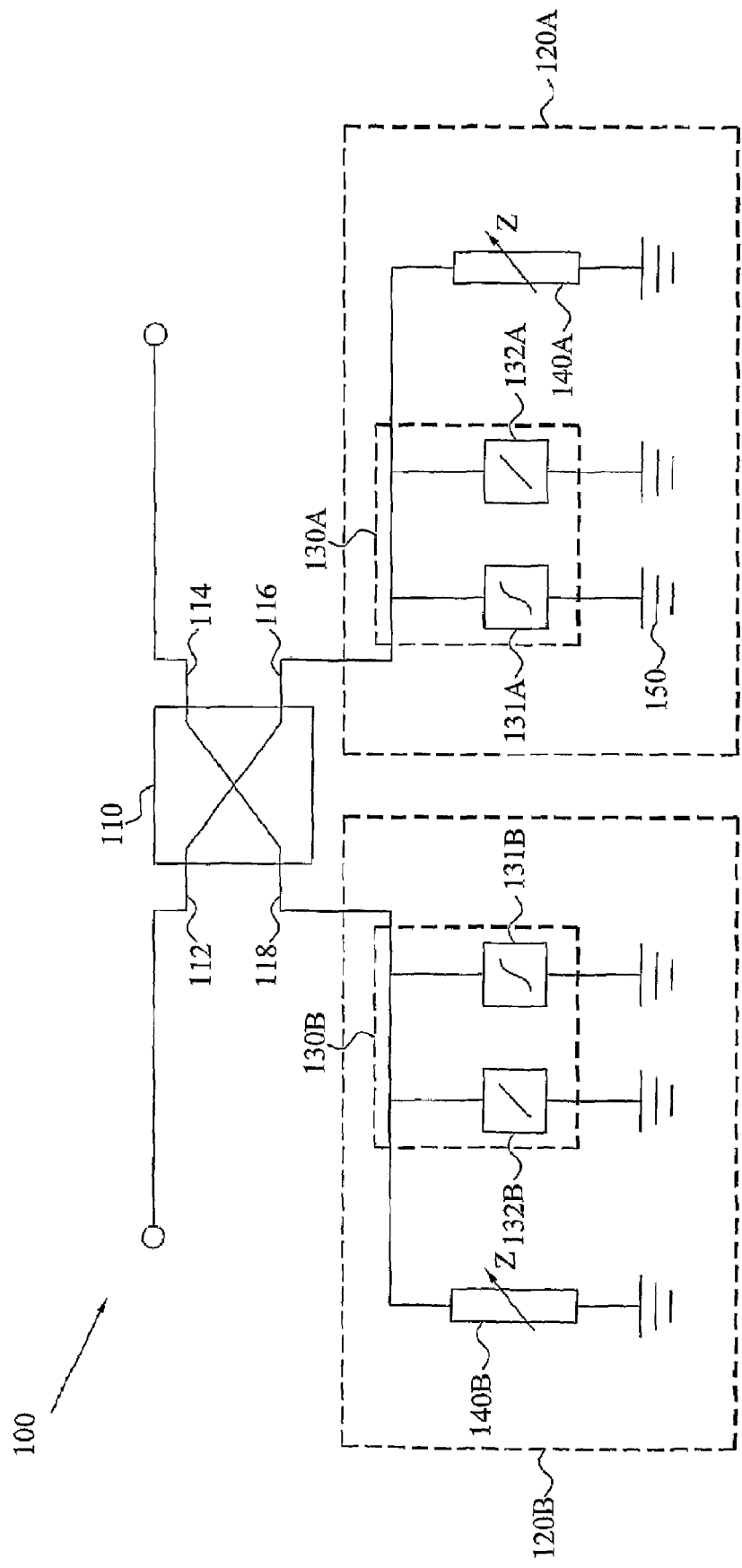
FIG. 4 is a schematic block diagram of a general embodiment of a predistorter according to the present invention.

FIG. 4 is a schematic block diagram of a general embodiment of a predistorter 100 according to the present invention. The predistorter 100 generally includes a coupler 110 that preferably is a 90 degrees (quadrature) coupler or hybrid, indicating that the relative coupled ports (sometimes denoted phase or tuned terminals or ports) differ by 90 degrees. An input port or terminal 112 of the coupler 110 is, during operation of the predistorter 100, connected for receiving an input signal, e.g. an input RF signal. Correspondingly, an output or isolation port 114 is, during operation, connected for outputting a predistorted output signal, e.g. a predistorted output RF signal. When the input signal is applied to the input port 112 of the coupler 110, the signal is split into a first signal reaching a first coupled port 116 and a second signal reaching a second coupled port 118. The first and second signals preferably have a 90 degrees phase difference and are equal in magnitude.

A first compensation or reflection circuit 120A is connected to the first coupled port 116. A corresponding second compensation or reflection circuit 120B is in turn connected to the second coupled port 118 of the coupler 110. In a preferred embodiment according to the invention the two compensation circuits 120A; 120B are identical in the arrangement of their electrical components, thus, providing a basically balanced circuitry. In the following, only the components of the first compensation circuit 120A will be described in detail, it being understood that the description applies to the second compensation circuit 120B as well. The components of the second compensation circuit 120B are identified by the same reference number as those of the first compensation circuit 120A with the notation B replacing A.

The compensation circuit 120A generally includes a combination 130A of linear 132A and nonlinear 131A circuit elements. In this embodiment, the nonlinear element or circuitry 131A and linear element or circuitry 132A are parallel connected and have a respective first end or terminal in connection with the first coupled port 116 and a second end in connection with an electrical ground 150.

According to the present invention, any nonlinear circuit element or circuitry 131A giving rise to nonlinear transfer characteristics and phase and/or amplitude expansion can be used in the compensation circuit 120A. Suitable such nonlinear circuit elements 131A include passive circuit elements, such as diodes, preferably Schottky diodes or other types of diodes. Although passive circuit elements, such as Schottky diodes, could be preferred in certain embodiments due to their low cost and low complexity also non-passive circuit elements such as transistors could be employed as nonlinear circuit element 131A according to the present invention. For example, the base-emitter electrodes of a bipolar transistor could be used as a diode in the nonlinear circuit element 131A. Also other transistor types including, but not limited to, Field Effect Transistors (FETs) can be employed according to the invention. As a person skilled in the art understands also a combination of multiple, i.e. at least two, (possibly different) passive circuit elements, a combination of multiple (possibly different) non-passive circuit elements or a combination of passive and non-passive circuit elements could be used as nonlinear circuitry 131A in the compensation circuit 120A.

The linear element 132A could be any linear circuit element or combination of linear circuit elements. Typically, such linear element 132A applicable in the compensation circuit 120A includes a resistor or a combination of multiple (possibly different) resistors, including resistors with variable or adjustable resistance.

The initial or basic amplitude gain and phase expansion of the predistorter 100 discussed above and represented by 60 and 80 in FIGS. 3A and 3B is then defined by the choice of used linear 132A and nonlinear 131A circuit elements. In this embodiment, the complex gain expansion is determined by the (resulting) resistance value of the linear circuit element 132A and the length of a line between the nonlinear 131A and the linear 132A circuit element, respectively.

In order to tune or adjust this complex gain expansion (amplitude and/or phase expansion) of the predistorter 100, the compensation circuit 120A includes an impedance varying unit or element 140A. This impedance varying unit 140A is preferably connected between the coupled port 116 and ground 150 and is configured for varying the load impedance seen or experienced by the nonlinear circuit element 131A, which in turn will control the complex gain expansion, i.e. the phase and/or amplitude expansion, of the predistorter 100, as is schematically illustrated by FIGS. 3A and 3B.

The impedance varying unit 140A could be operated for manually adjusting the impedance seen by the nonlinear circuit element 131A. This can be realized by using a circuitry or circuit element having an adjustable reactance or capacitance as the impedance varying unit 140A. In such a case, an operator can manually, such as mechanically, adjust the reactance or capacitance of this impedance varying unit 140A, which in turn adjusts the impedance experienced by the nonlinear circuit element 131A and, thus, the phase and/or amplitude expansion of the predistorter 100.

Alternatively, the impedance adjusting unit 140A could be electrically operated so that the impedance seen by the nonlinear circuit element 131A is varied or tuned by applying an electrical signal to the impedance adjusting unit 140A, which is discussed in more detail below.

The present invention is not limited to a predistorter 100 with a respective compensation circuit 120A; 120B that has a combination 130A; 130B of linear 132A; 132B and nonlinear 131A; 131B circuit elements connected in parallel with the impedance adjusting unit 140A; 140B as illustrated in FIG. 4. As is further disclosed in FIG. 5, also a series connection of the linear circuit element 132A; 132B and the impedance varying unit 140A; 140B is possible according to the present invention. In such a case, the nonlinear circuit element 131A has its first end in connection with the first coupled port 116 of the coupler and the second end connected to ground 150. Correspondingly, the linear circuit element 132A has its first end in connection with the first coupled port 116 and the second end in connection with the impedance varying unit 140A.

Similar circuit elements as were discussed above in connection with FIG. 4 can be used as linear 132A and nonlinear 131A circuit elements also for this embodiment. Correspondingly, the basic phase and amplitude expansion of the predistorter 100 is set by this choice of circuit elements.

The impedance varying unit 140A is arranged in the compensation circuit 120A for adjusting the load impedance seen by the nonlinear circuit element 131A, which in turn adjust the phase and/or amplitude expansion of the predistorter 100.

As is well known to the person skilled in the art, a quarter-wave transformer can be used to invert or transform a parallel circuit into a series circuit. For example, assume that such a quarter-wave transformer is provided in the combination circuit 130A of the compensation circuit 120A in FIG. 4, e.g. provided between the linear 132A and nonlinear 131A circuit elements. Let R denote the resulting resistance of the linear circuit 132A and X denote the reactance of the impedance varying unit, then the combined impedance $Z_L$ of the linear circuit element 132A and impedance varying unit 140A could be expressed as $$Z_L = \frac{1}{\frac{1}{R} + \frac{1}{X}}.$$

If $Z_{tr}$ denote the impedance of the quarter-wave transformer the resulting impedance $Z_{res}$ seen by the nonlinear circuit element 131A will be $$Z_{res} = \frac{Z_{tr}^2}{R} + \frac{Z_{tr}^2}{X}.$$

Figure 5:
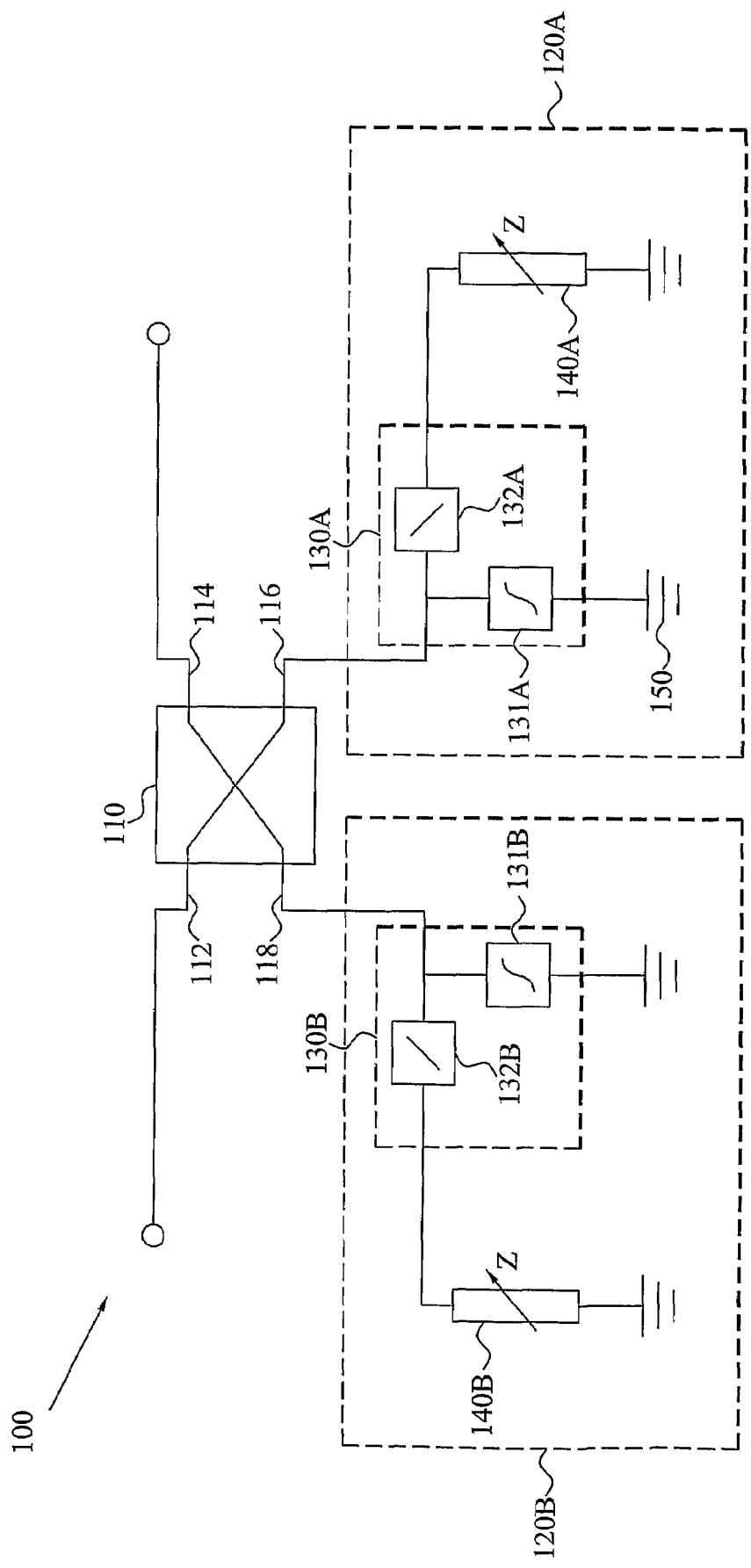
FIG. 5 is a schematic block diagram of another general embodiment of a predistorter according to the present invention.

As a consequence, a series connection as illustrated in FIG. 5 has been obtained. The linear circuit element 132A in FIG. 5 will then have a resistance of $$\frac{Z_{tr}^2}{R}$$

and the reactance of the impedance varying unit 140A in FIG. 5 will be $$\frac{Z_{tr}^2}{X}.$$

When the present invention is discussed and disclosed with reference to a compensation circuit 120A implemented as a parallel (series) connection of linear circuit element 132A and the impedance varying unit 140A (and the nonlinear 131A circuit element), a corresponding series (parallel) circuit is also within the scope of the invention. An interchange between such circuit solutions can be realized by introducing the quarter-wave transformer as illustrated in above. A line length of about 20 mm typically represents a quarter-wave transformer in RF applications.

Figure 6:
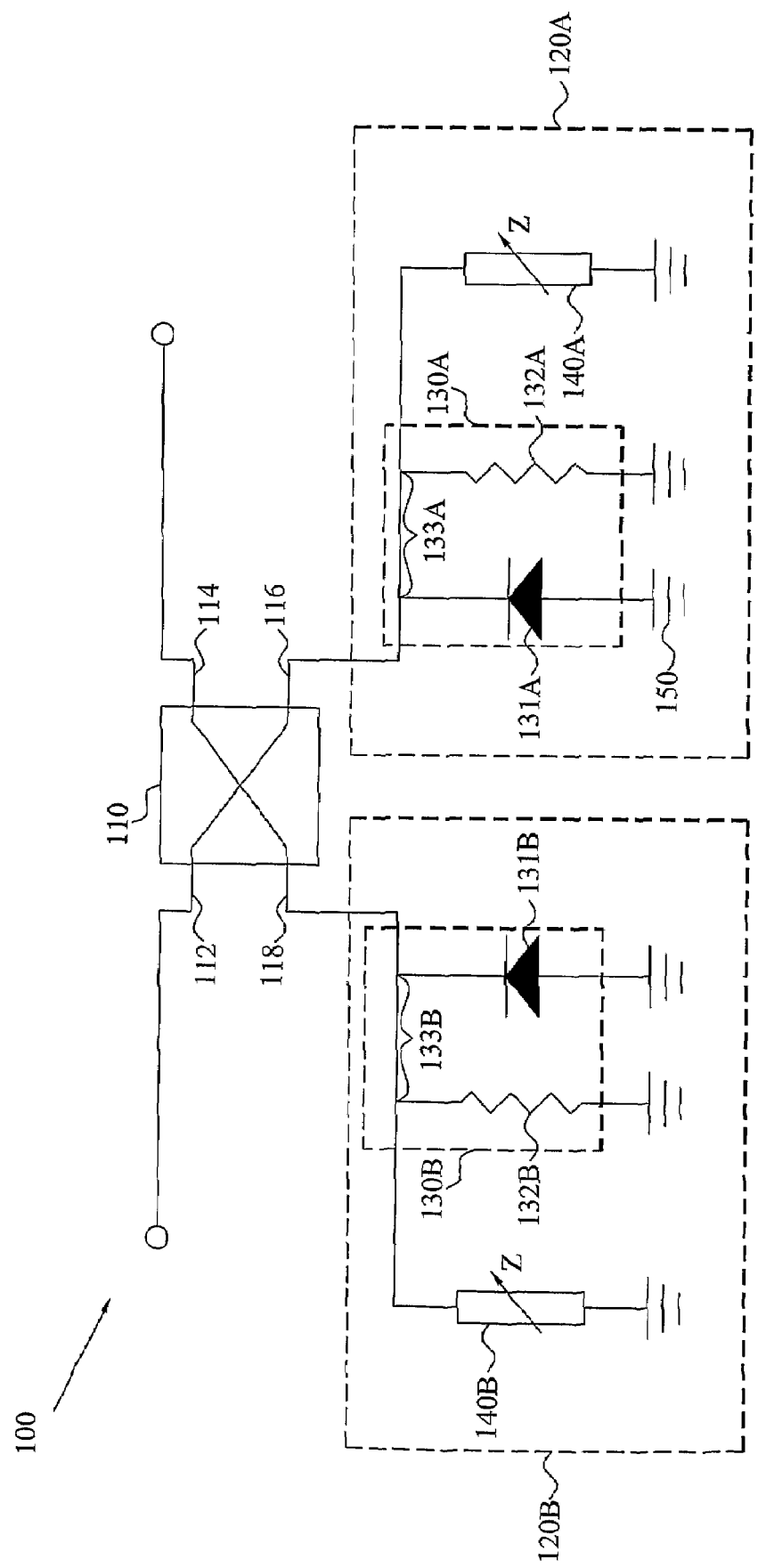
FIG. 6 is a schematic block diagram of an embodiment of a predistorter according to the present invention.

FIG. 6 illustrates an embodiment of a tunable predistorter 100 according to the present invention. In this embodiment, the (passive) nonlinear element is represented by a diode 131A, preferably a Schottky diode, having its cathode end in connection with the coupled port 116 of the coupler 110 and its anode end in connection with the electrical ground 150. The linear element is represented by a resistance or resistor 132A connected in parallel with the Shottky diode 131A, i.e. having a first end in connection with the coupled port 116 of the coupler 110 and a second opposite end in connection with ground 150. The initial or basic gain and phase expansion of the predistorter 100 discussed above and represented by 60 and 80 in FIGS. 3A and 3B are then determined by the value of the resistance 132A and the length of a line 133A between the diode 131A and the resistance 132A, respectively.

The impedance varying unit 140A is arranged in the compensation circuit 120A for tuning or adjusting the amplitude and/or phase expansion of the predistorter 100 by varying the load impedance seen by the Schottky diode 131A.

In an alternative embodiment of the invention, the Schottky diode 131A could be arranged with its anode end in connection with the coupled port 116 of the coupler 110 and its cathode end connected to ground 150. Furthermore, multiple parallel connected Schottky diodes 131A can be used in the compensation circuit 120A. These diodes are then preferably connected in a head-to-head configuration with their respective cathode ends in connection with the coupled port 116 and the anode ends connected to ground 150. However, also an opposite head-to-head configuration (cathodes connected to ground 150 and anodes connected to the coupled port 116) or a head-to-tail configuration is possible.

In correspondence with the usage of multiple Schottky diodes 131A, the compensation circuit 120A can include multiple parallel connected resistances or resistors 132A. In such a case, the initial amplitude gain expansion of the predistorter 100 depends on the values of these multiple resistances.

Figure 7:
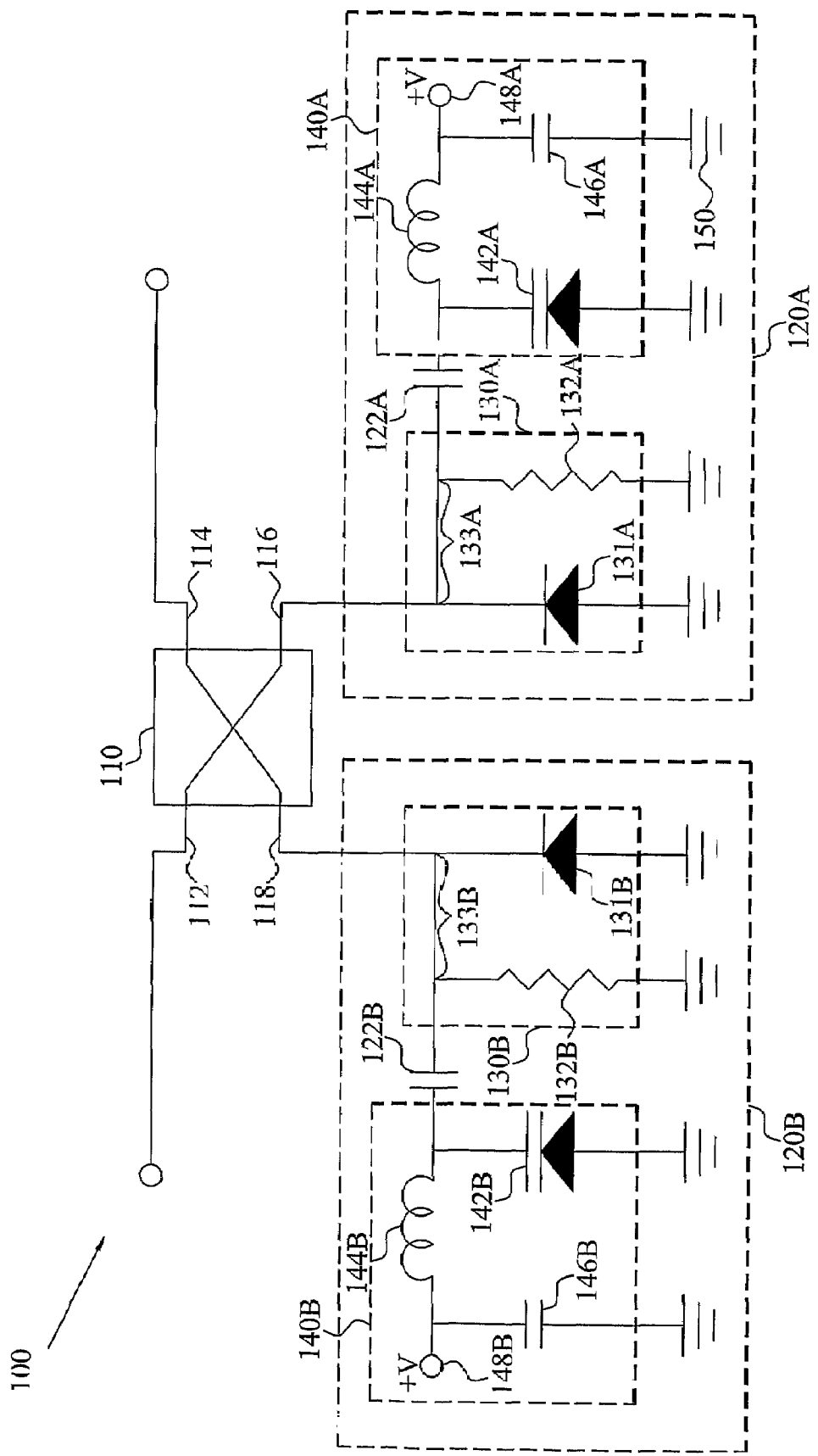
FIG. 7 is a schematic block diagram of another embodiment of a predistorter according to the present invention.

FIG. 7 illustrates another embodiment of a tunable analog predistorter 100 according to the present invention. This embodiment has an electrically operated impedance varying unit 140A. The coupler 110, the combination circuits 130A; 130B with the Schottky diodes 131A; 131B and resistances 132A; 132B are similar to the embodiment discussed above in connection with FIG. 6 and are not further described.

In this embodiment, the impedance varying unit 140A is realized as a varicap diode 142A electrically biased and controlled by a, preferably variable, voltage source 148A. The compensation circuit 120A further preferably includes a capacitance or capacitor 122A arranged between the cathode end of the varicap diode 142A and the parallel circuit 130A of the resistance 132A and the Schottky diode 131A. This capacitance 122A will function as a direct current (DC) coupling block. Any other circuit element having this DC coupling functionality can replace the capacitance 122A. The DC bias due to the (variable) voltage source 148A is fed to the variacap diode 142A through a series inductor 144A bypassed to ground 150 by a capacitor 146A.

In this embodiment of the invention, the initial or basic amplitude gain expansion of the predistorter 100 is determined by the value of the resistance 132A. The corresponding initial phase expansion is in turn defined by the length of the line 133A between the Schottky diode 131A and the resistance 132A and the value of the capacitance 122A.

In order to adjust this initial phase and/or amplitude expansion defined by the values of the selected circuit elements, the voltage provided by the voltage source 148A is preferably adjusted. The voltage of the voltage source 148A could be manually adjusted or adjusted based on a voltage change signal provided from some other unit provided in the same signal processing unit or transmitter as the predistorter 100, which is discussed in more detail below. In either case, the voltage adjustment changes the DC bias or voltage experienced by the varicap diode 142A. The bias change in turn adjusts the capacitance of the diode 142A, which affects the load impedance seen by the Schottky diode 131A. As a consequence of this load impedance change the phase and/or amplitude expansions of the predistorter 110 is changed. Depending on, the bias level applied to the varicap diode 142A, the phase (amplitude) expansion of the predistorter 110 can be independently changed from the amplitude (phase) expansion. In addition, for certain bias levels and bias level changes a combined phase and gain expansion adjustment is obtained.

In certain embodiments, it could be possible to use a combination of multiple varicap diodes 142A, preferably connected in parallel with their respective cathode ends connected to the variable voltage source 148A, possibly via the inductor 144A, and the anode ends in connection with ground 150.

The variable voltage sources 148A; 148B of the impedance varying units 140A; 140B could be implemented as two separate voltage sources. In certain implementations, in particular when the two compensation circuits 120A; 120B include identical circuit elements, a single voltage source 148A could be used for providing a same variable voltage or bias to the varicap diodes 142A; 142B in the two impedance varying units 140A; 140B.

Figure 8:
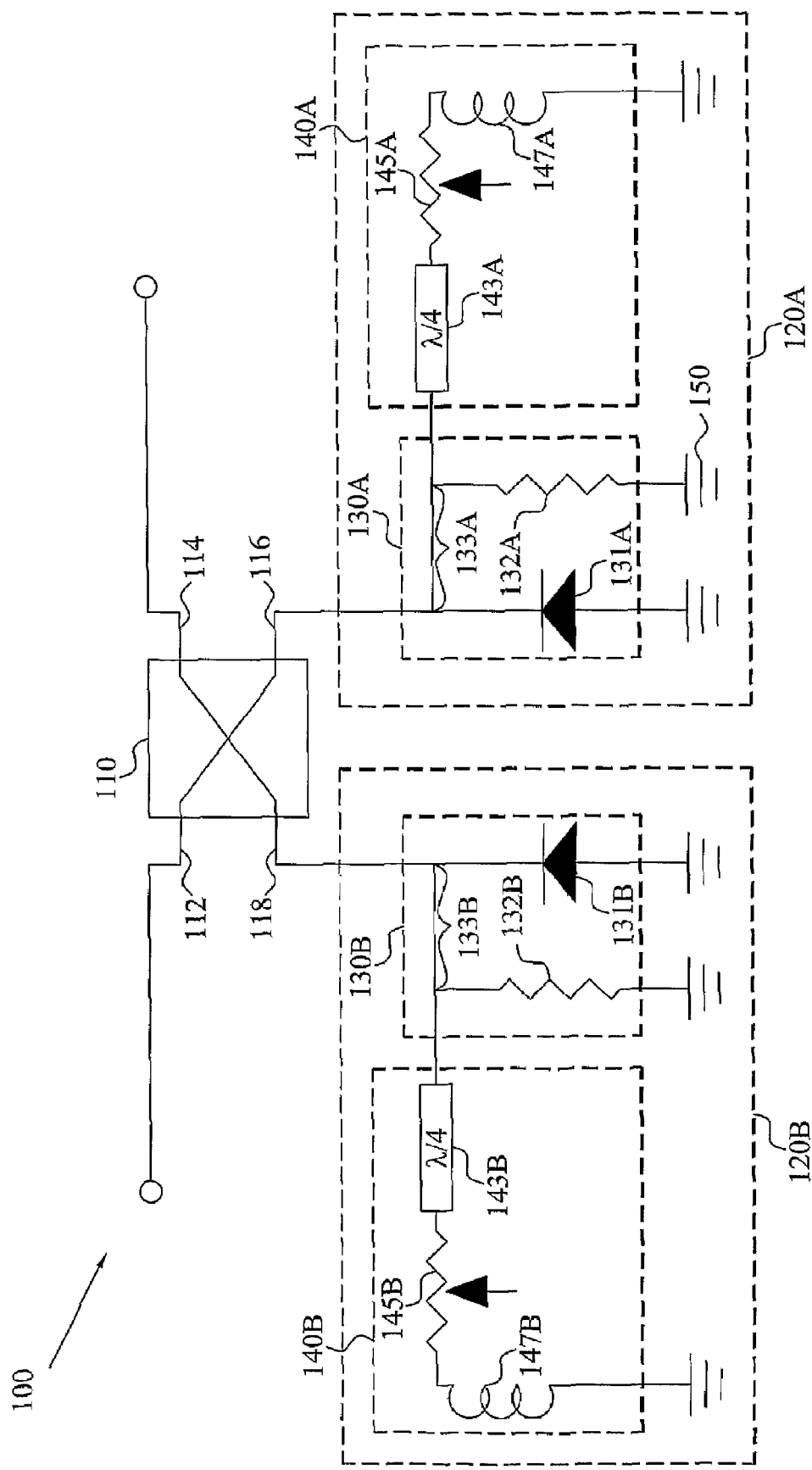
FIG. 8 is a schematic block diagram of yet another embodiment of a predistorter according to the present invention.

FIG. 8 illustrates a further embodiment of a tunable predistorter 110 according to the present invention. This predistorter 110 is similar to the predistorter disclosed in FIG. 7 and discussed above except usage of a different impedance varying unit 140A.

This embodiment of the impedance varying unit 140A has a variable reactance that will adjust the impedance seen by the Schottky diode 131A. The variable reactance is realized by a variable resistance 145A in combination with a reactive element 147A, non-limitedly represented by an inductor in the figure, and a quarter-wave transformer 143A. The variable resistance functionality can be obtained through usage of a variable resistor 145A with a mechanically or possibly electrically adjustable resistance. In alternative implementations, the variable resistor can be exchanged by, or complemented with, a positive-intrinsic-negative (PIN) diode and/or a FET transistor, or other similar elements. In such a case, the resistance can be electrically changed or adjusted by providing a variable DC voltage or bias to the PIN diode or FET transistor. In correspondence with the impedance calculations above, the impedance of the impedance varying unit 140A and, thus, the impedance $Z_{res}$ seen by the Schottky diode 131A can be represented as $$Z_{res} = Z_{tr}^2 \left( \frac{R}{R^2 + X^2} - \frac{X}{R^2 + X^2} j \right) = R_{tot} - jX_{tot},$$

where R denotes the (variable) resistance 145A, X is the reactance of the inductor 147A and $Z_{tr}$ is the impedance of the quarter-wave transformer 143A. By then varying the resistance R, the reactance $X_{tot}$ of the impedance varying unit 140A can be changed, whereas the resistance $R_{tot}$ of the impedance varying unit 140A remains fairly constant or only varies slightly. For example, assume that X=1Ω, $Z_{tr}$=1Ω and 0.5Ω≦R≦2Ω then $R_{tot}$ will vary slightly around the value 0.45Ω (0.40Ω≦$R_{tot}$≦0.50Ω), whereas the reactance $X_{tot}$ can be adjusted between 0.20Ω and 0.80Ω.

This very simple example is merely provided for illustrating the possibility of providing a variable reactance of the impedance adjusting unit 140A and, thus, a variable impedance seen by the Schottky diode 131A and adjustable phase and/or amplitude expansion of the predistorter 100 by varying the resistance 145B of the impedance varying unit 140A disclosed in FIG. 8. It is anticipated by the invention that other resistance and reactance values given above are only for illustrative and non-limiting purposes.

Figure 9:
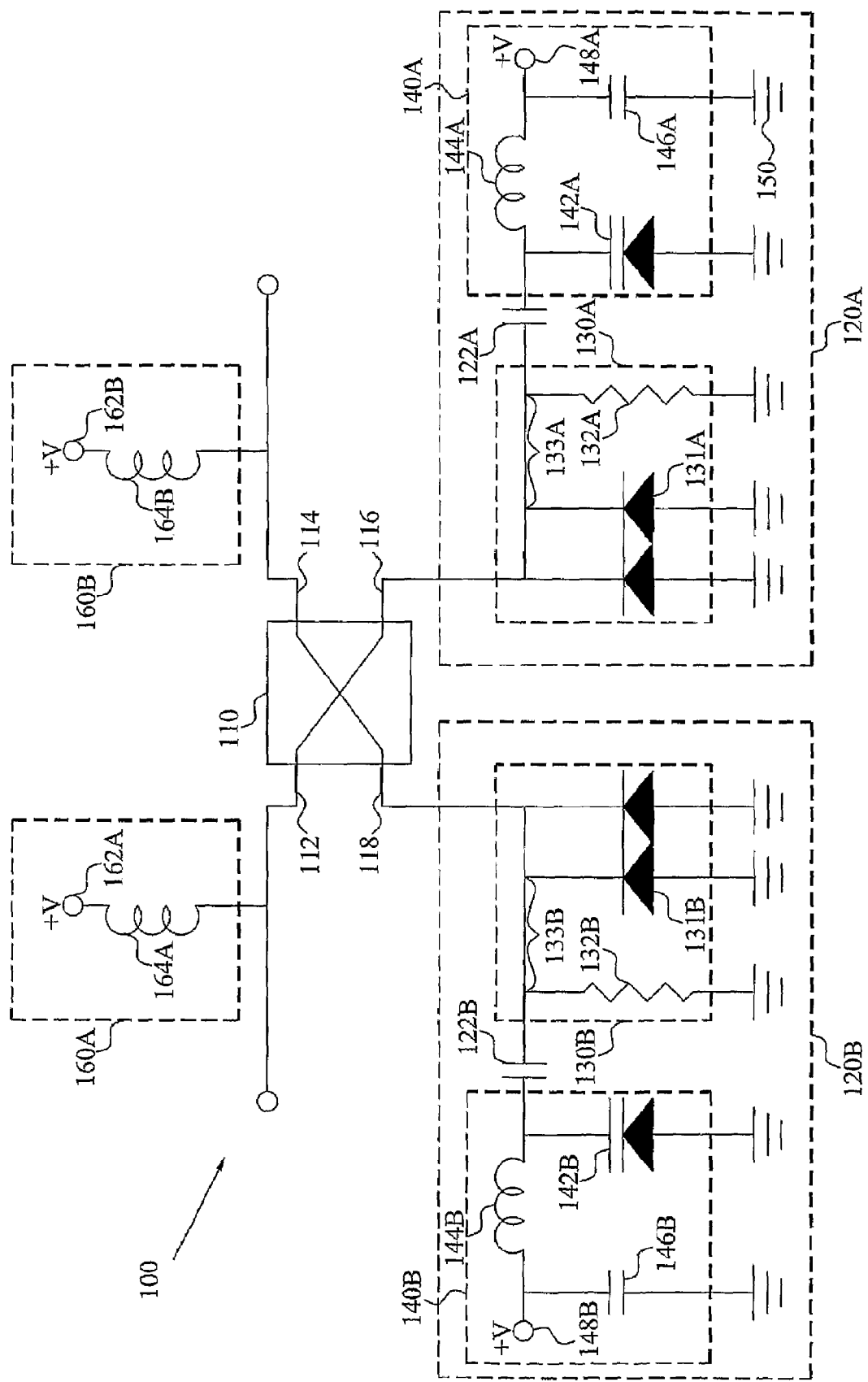
FIG. 9 is a schematic block diagram of a further embodiment of a predistorter according to the present invention.

FIG. 9 illustrates yet another embodiment of a predistorter 100 according to the present invention. In this embodiment, the compensation circuit 120A comprises two parallel head-to-head connected Schottky diodes 131A instead of a single diode as for the embodiments of FIGS. 6 to 8. Moreover, the compensation circuit 120A includes similar circuit elements as the embodiment discussed above in connection with FIG. 7. This predistorter 100 includes a respective bias network or circuit 160A; 160B connected to the input 112 and output 114 port of the coupler 110. In this simple realization of the bias circuit 160A; 160B, a (variable) voltage source 162A; 162B conditions the DC bias level through an inductor 164A; 164B for the compensation circuit 120A; 120B. In an alternative biasing circuit realization, a resistance could be arranged between the voltage source 160A; 160B and the impedance 164A; 164B. In addition, a capacitance or a capacitance pair could then be connected between ground 150 and the connection between the resistance and the impedance 164A; 164B.

In either case, the bias level provided by the bias circuits 160A; 160B controls the nonlinear behavior point ($P_S$ in FIGS. 3A and 3B) of the predistorter 100. Thus, in this embodiment of the invention the power level where the nonlinear phase and amplitude gain behavior of the predistorter 100 start can be adjusted by varying the voltage provided by the voltage sources 162A; 162B. In addition, also the phase and/or amplitude expansion can be adjusted by varying the bias provided to the varicap diodes 142A; 142B from the variable voltage sources 148A; 148B. Thus, the present invention provides another degree of freedom when tuning the predistorter 100 and, thus, when tuning an amplifier predistorted by the predistorter 100.

Figure 10A:
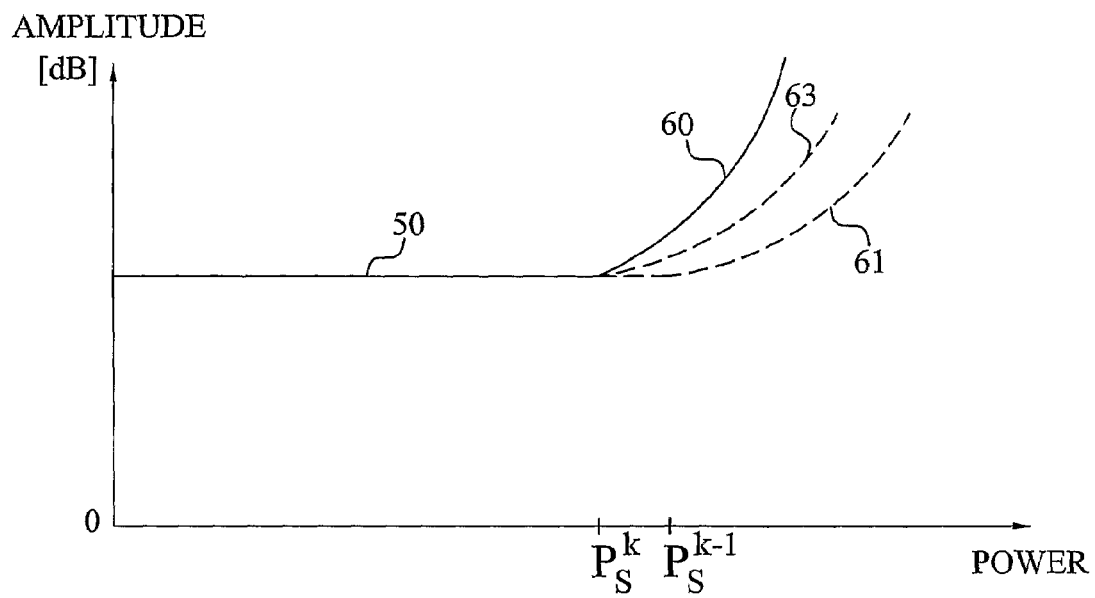
FIG. 10A is another diagram schematically illustrating the tunable amplitude gain transfer characteristics of a predistorter according to the invention at different power levels.
Figure 10B:
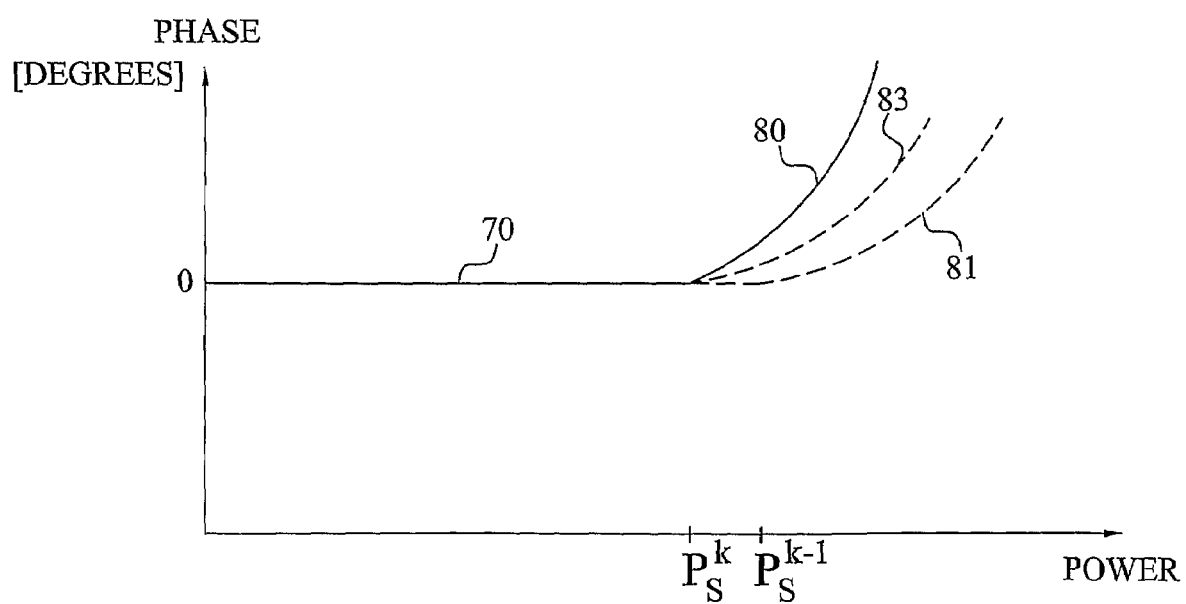
FIG. 10B is another diagram schematically illustrating the tunable phase transfer characteristics of a predistorter according to the invention at different power levels.

FIGS. 10A and 10B are diagrams illustrating how a predistorter embodiment discussed above in connection with FIG. 9 can be tuned. As was discussed in the foregoing, the predistorter has a basic or initial compensation characteristic with a linear amplitude gain 50 and phase 70 portion followed by a complex gain expansion 61; 81 above an initiation power level $P_S^{k-1}$. The power value $P_S^{k-1}$ of this nonlinear behavior initiation point and the shape of the initial amplitude 61 and phase 81 expansions are defined by the components in the compensation circuits of the predistorter.

With reference to FIGS. 9, 10A and 10B, when tuning the predistorter 100, a coarse tuning is preferably first performed by varying the bias provided by the bias circuits 160A; 160B. This course tuning moves the nonlinear behavior point of the predistorter 100 from a previous initiation power level $P_S^{k-1}$ to a (correct) current power level $P_S^k$. This correct power level $P_S^k$ is typically defined by the connected amplifier or other circuitry that the predistorter 100 should linearize. Once this course tuning has been conducted, the resulting compensation characteristics are represented by the lines 50, 63 and 70, 83 in FIGS. 10A and 10B, respectively.

The nonlinear phase 83 and amplitude 63 characteristics (expansion) of the predistorter 100 can now be adjusted by varying the bias experienced by the varicap diodes 142A; 142B. The varicap bias (the provided voltage of the voltage sources 148A; 148B) is then adjusted until the nonlinear amplitude 60 and phase 80 expansion and behavior of the predistorter 100 is equal to or close to the inverse of the amplitude gain and phase (compression) characteristics of the amplifier.

In some embodiments, an iterative procedure may be required, where first the voltage sources 162A; 162B are controlled to produce correct nonlinear behavior point $P_S^k$ and then the voltage sources 148A; 148B are controlled to obtain correct phase and/or amplitude expansion. It may then be required to anew correct the saturation power level by adjusting the voltage sources 162A; 162B and thereafter adjust the voltage sources 148A; 148B.

The adjustment could be realized by starting from e.g. the initial compensation characteristics 50, 61 and 70, 81 of the predistorter 100 and then adjusting the different variable voltage sources 162A, 162B; 148A, 148B in small steps and detect the output signal of the amplifier (or other circuitry with nonlinear gain compression) to see if the amplifier has become more linearized. The (small) changes in bias voltage are continued until a (close to) maximum or at least adequate linearization has been obtained. This procedure could be performed manually by an operator that then investigates the amplifier output and adjusts the provided DC biases based on this signal output investigation. In an alternative implementation, an automatic adjustment could be used. In such a case, a unit is arranged for detecting the amplifier output and generating voltage adjustment commands or signals based on this output detection. The adjustment commands are then forwarded to the respective variable voltage sources 162A, 162B; 148A, 148B that will adjust the delivered DC biases based on the adjustment commands.

Also more sophisticated methods and techniques such as Monte Carlo simulation or neural networks could be employed for adjusting and providing correct biases that will generate a satisfactory phase and amplitude expansion of the predistorter 100.

Figure 11:
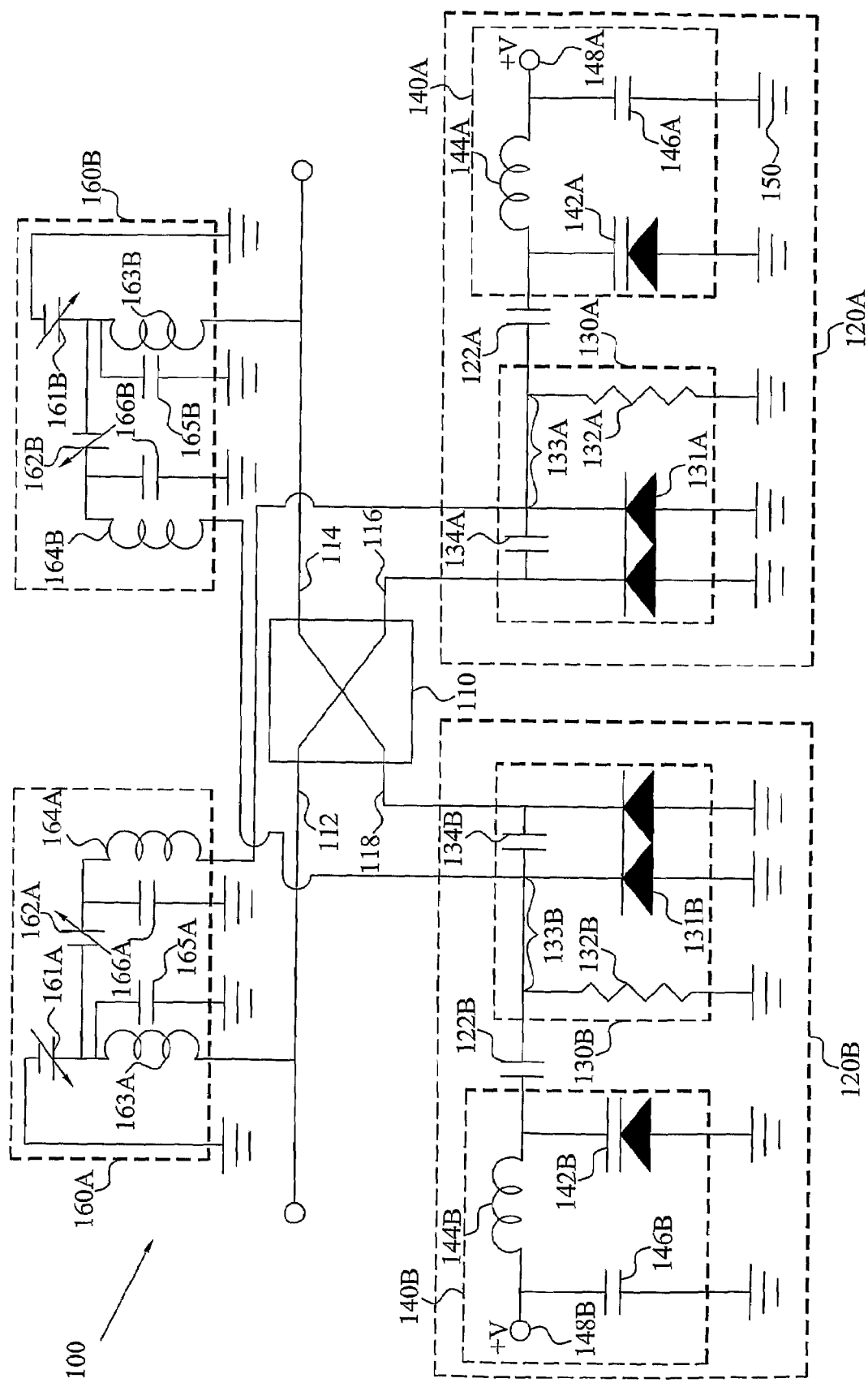
FIG. 11 is a schematic block diagram of still another embodiment of a predistorter according to the present invention.

FIG. 11 illustrates a further embodiment of a predistorter 100 according to the present invention. This embodiment is similar to the predistorter discussed above in connection to FIG. 9. However, in the predistorter 100 of FIG. 11 the (Schottky) diodes 131A in the compensation circuit 140A are biased independently by a respective variable voltage source 161A; 162A provided in the bias circuit 160A. In this embodiment, the bias circuit 160A includes a first variable voltage source 161A having a first end in connection with electrical ground 150 and its second end in connection with a first inductor 163A bypassed to ground 150 by a first capacitor 165A. As is well known in the art, the inductor 163A serves as an alternating current (AC) decoupling element and is arranged for filtering the (RF) signal from the DC supply voltage 161A, i.e. block transmission of the (RF) signal to the variable voltage supply or source 161A and simultaneously provide a current path. This inductor 163A can be replaced by other circuit elements fulfilling similar AC filtering function, e.g. resistors, low frequency signal filtering circuits.

The second variable voltage source 162A has in this embodiment a first end in connection with the second end of the first voltage source 161A and its second end in connection with a second inductor 164A bypassed to ground 150 by a second capacitor 166A.

Thus, the first voltage source 161A is provided for delivering a first variable DC bias to the first Schottky diode of the diode pair 131A, whereas the second voltage source 162A provides a second variable DC bias to the second Schottky diode of the diode pair 131A. In addition, the two diodes 131A preferably have their cathode ends isolated by a DC blocking element such as a capacitor 134A.

It is anticipated by the present invention that the actual design of the bias circuit 160A and its included element may differ from what is disclosed in FIG. 11. Any bias circuitry that can provide two separate DC biases, one such DC bias to each of the Schottky diodes 131A of the compensation circuit 120A, can be employed according to the invention.

In some embodiments a single bias circuit 160A could be employed for providing variable DC biases to the Schottky diodes 131A; 131B of the two compensation circuits 120A; 120B. In such a case, the first voltage source 161A delivers an adjustable DC bias to the first diode in both diode pairs 131A; 131B. The second voltage source 162A will likewise provide a variable DC voltage bias to the second diode in both diode pairs 131A; 131B.

This idea of individual DC biasing for the Schottky diodes or other nonlinear circuit elements 131A; 131B of the compensation circuits 120A; 120B can be extended to the case when more than two Schottky diodes (nonlinear circuit elements) are used in each compensation circuit 120A; 120B. For example, assume that the compensation circuits 120A; 120B each includes N (parallel) connected Schottky diodes 131A; 131B, preferably separated by a DC blocking element 134A as illustrated in FIG. 11, then the bias circuits 161A; 161B each preferably includes up to N (variable) voltage sources 161A, 162A; 161B, 162B, where N≧1. However, the gain in adding one further diode, DC blocking element and variable voltage source per compensation circuit 120A; 120B to the embodiment of FIG. 11 is relative small. As a consequence, in most applications it will be enough to use two independently biased Schottky diodes 131A; 131B per compensation circuit 120A; 120B.

Figure 12A:
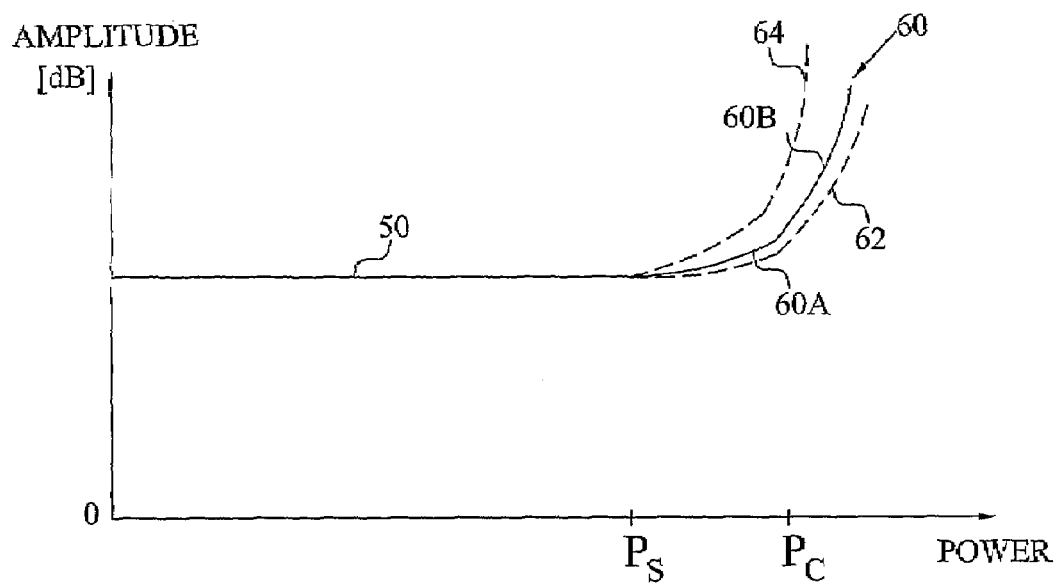
FIG. 12A is a diagram schematically illustrating the tunable amplitude gain transfer characteristics of the predistorter of FIG. 11 at different power levels.
Figure 12B:
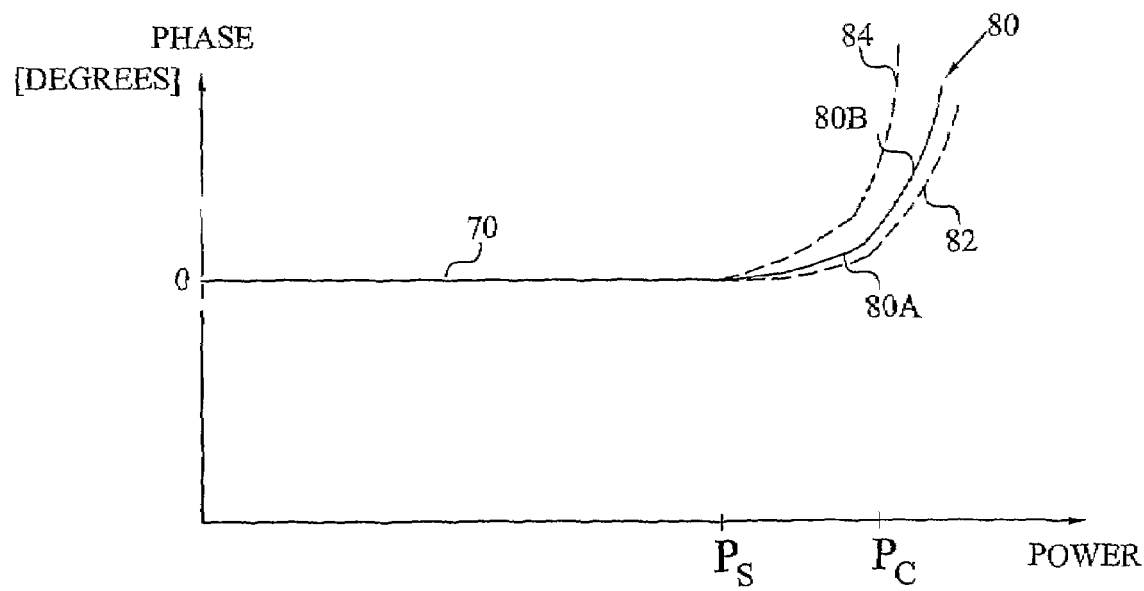
FIG. 12B is a diagram schematically illustrating the tunable phase transfer characteristics of the predistorter of FIG. 11 at different power levels.

A typical complex gain expansion of the predistorter embodiment of FIG. 11 is illustrated in FIGS. 12A and 12B. As a consequence of the individually biased diodes, the nonlinear part 60; 80 of the compensation characteristics curves will typically include two portions 60A, 60B; 80A, 80B. As was noted above, the nonlinear behavior is initiated at a power level $P_S$ determined by the choice of circuit elements in the compensation circuits and by the DC bias provided to a first diode in each diode pair. The shape of the first portions of the amplitude 60A and phase 80A expansion curves will be due to the operation of these first diodes. However, at the clipping power level $P_C$ the second diode of the two diode pairs will come into action. As a result, the shape of the portions of the expansion curves 60B; 80B above this power level $P_C$ typically differs from the shape or slope of the curves 60A; 80A in the power interval $P_S$ to $P_C$. By employing more than two individually biased Schottky diodes the nonlinear expansion curves 60; 80 will constitute of more than two such sub-curves 60A, 60B; 80A; 80B.

The amplitude 60 and/or phase 80 expansion can then be adjusted as was discussed in connection with FIGS. 10A and 10B. Thus, by adjusting the voltage of the first voltage source (s) in the bias circuit(s) the nonlinear behavior initiation point $P_S$ can be moved to another power level. Adjusting the voltage of the second voltage source(s) in the bias circuit(s) will control the clipping point $P_C$, i.e. the power level at which the clipping behavior is initiated can be adjusted. The shape of the expansion curves 60, 80, thus the slope of the curves 60, 80 can then be adjusted between the minimum 62; 82 and maximum 64; 84 curve limits by varying the voltage provided by the voltage source(s) in the impedance adjusting units.

It is anticipated by the present invention that the different embodiments or at least portions of the different embodiments of the predistorter discussed above and disclosed in FIGS. 4-9 and 11 may be combined.

Any of the previously described and disclosed predistorter embodiments that employ multiple nonlinear circuit elements, e.g. Schottky diodes, per compensation circuit can be equipped with more than one impedance varying unit per compensation circuit. For example, if each compensation circuit includes N Schottky diodes (possibly separated by DC blocking elements and optionally individually biased), each such compensation circuit can include M impedance varying units, where N≧2 and 1≦M≦N. In such a case, each Schottky diode (nonlinear circuit element) or group of at least one Schottky diode can be connected and controlled by an impedance varying unit. This means that the different diodes or diode groups may experience different load impedances.

Figure 13A:
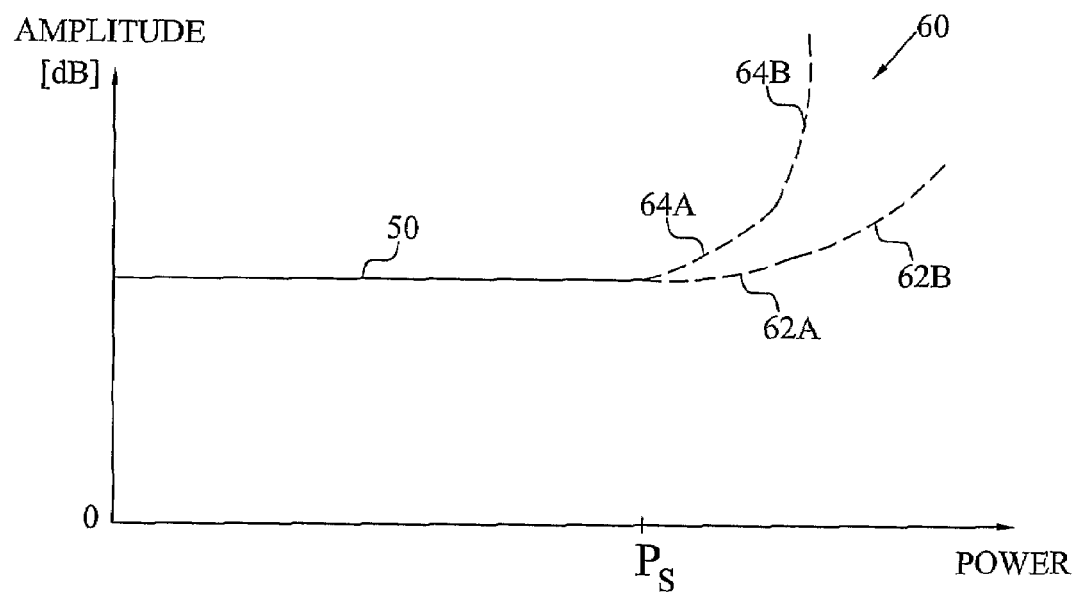
FIG. 13A is a diagram schematically illustrating the tunable amplitude gain transfer characteristics at different power levels for a predistorter having two nonlinear circuit elements and impedance varying units per compensation circuit.
Figure 13B:
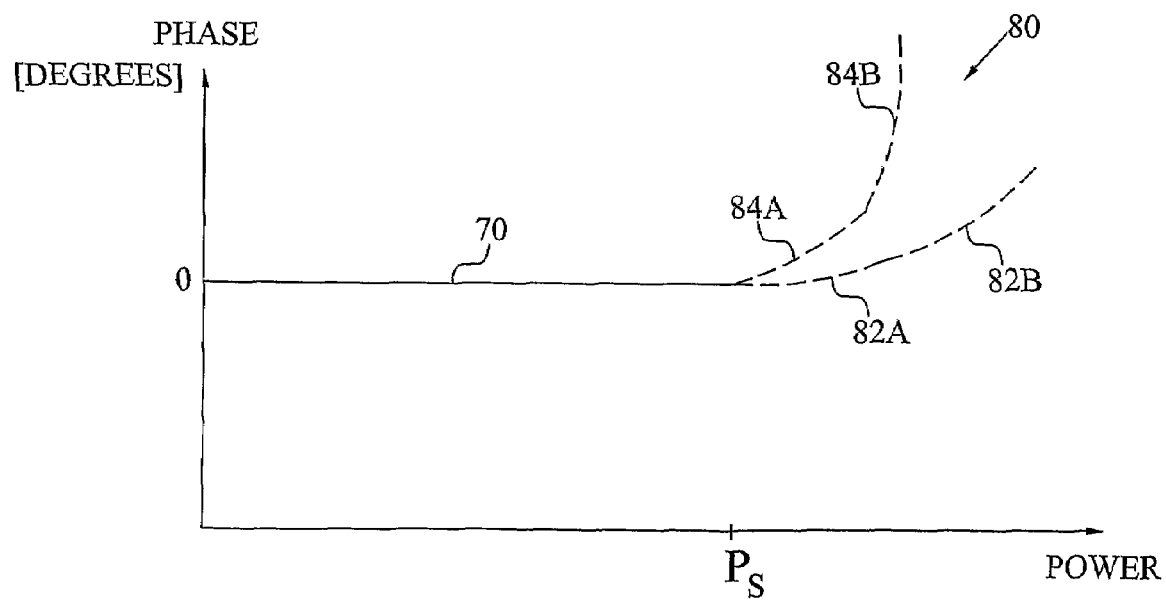
FIG. 13B is a diagram schematically illustrating the tunable phase transfer characteristics at different power levels for a predistorter having two nonlinear circuit elements and impedance varying units per compensation circuit.

FIGS. 13A and 13B schematically illustrate a possible complex gain expansion for a predistorter having two nonlinear circuit elements (Schottky diodes) per compensation circuit and where each nonlinear circuit element is connected to and experience the load impedance from a separate impedance varying unit. Similar to FIGS. 12A and 12B, the nonlinear part 60; 80 of the compensation characteristics curves includes two portions. The shape of the first portion 62A, 64A; 82A, 84A is due to the first diode and impedance varying unit. This curve portion can, by varying the impedance load exerted by the first impedance varying unit and seen by the first diode, reach a value between the minimum 62A; 82A and maximum expansion curves 64A; 84A. Correspondingly, the second portion can take a value, by varying the load impedance exerted by the second impedance varying unit and seen by the second diode, between the minimum 62B; 82B and maximum expansion curves 64B; 84B. This independent load impedance adjustment typically allows for a larger range of attainable gain/phase values for the predistorter and thereby a larger compensation range.

FIG. 14 is a flow diagram of tuning an analog predistorter according to the present invention. In a first step S1, the combination of linear and nonlinear circuit elements to use in the two compensation circuits is selected. In a preferred embodiment, similar such linear and nonlinear circuit elements are preferably used in the two compensation circuits so that they could be regarded as each other's reflections. This selection or choice of circuit elements will define the basic or initial compensation characteristics and nonlinear complex gain expansion of the predistorter. In a next step S2, the impedances seen by the nonlinear circuit elements in the compensation circuits are adjusted to vary or adjust the complex gain expansion, i.e. the amplitude and/or phase expansion, of the predistorter. Depending on the actual impedance adjustment (increase/decrease) it will be possible to independently adjust the amplitude expansion or the phase expansion of the predistorter. In addition, also a combined amplitude and phase expansion adjustment can be obtained.

The impedance adjustment can be realized by adjusting the reactance or capacitance of a circuit element or circuitry in the impedance adjusting unit. Such a capacitance or reactance adjustment can be performed mechanically or electrically. In the former case, the capacitance of a variable capacitor or the resistance of a variable resistor could be manually (and mechanically) adjusted by an operator. In an electrical adjustment, an adjusting DC bias can be applied to different circuit elements, such as varicap diodes, PIN diodes, FET transistors, for obtaining a variable reactance or capacitance.

This impedance adjustment is preferably continued or repeated, schematically illustrated by the line L1 in the figure, until a sufficient predistortion is obtained that will linearize a connected amplifier or other circuitry with nonlinear transfer characteristic (complex gain compression). Once satisfactory compensation characteristics of the predistorter have been obtained the method ends and the predistorter can be put into operation for predistorting a signal, preferably RF, signal to be input to the amplifier.

FIG. 15 is a flow diagram illustrating an embodiment of the impedance adjusting step of FIG. 13 in more detail. The method continues from step S1. In a next step S10, DC biases in the compensation circuit is adjusted, preferably through usage of variable voltage sources. These DC biases will control the power level at which the nonlinear expansion behavior is initiated and/or the power level of different clipping points in the amplitude and phase expansion curve. Thus, in this embodiment a single DC bias or multiple different DC biases per compensation circuit can be adjusted in this step S10. The biases provided by the variable voltage sources are preferably adjusted until the expansion initiation power point corresponds to the power point or level at which the complex gain compression or nonlinear behavior of the amplifier (or other circuitry that should be linearized by the predistorter) is initiated. The clipping points can also be moved to different power levels by adjusting the provided DC voltages so that the complex gain expansion of the predistorter will be as close as possible to the inverse of the complex gain compression of the amplifier.

Once this course adjustment is completed, the impedances of the impedance adjusting units connected to the compensation circuits are adjusted in step S11. In this embodiment, this impedance adjustment is obtained through adjusting the biases to e.g. varicap diodes of the impedance adjusting units. Such DC bias changes will adjust the capacitances of the varicap diodes, which in turn changes the load impedances seen by the nonlinear circuit elements of the compensation circuits, resulting in a phase and/or amplitude expansion adjustment.

In the case of at least two impedance varying units and varicap diodes per compensation circuit, the biases to the varicap diodes can be adjusted to different DC bias levels in order to obtain the desired complex gain expansion. The two steps S10 and S11 could be repeated several times, schematically represented by the lines L2 and L3, until desired phase and amplitude gain expansion curves and compensation characteristics of the predistorter is obtained. In addition, during operation of the predistorter, the transfer characteristics of the amplifier that the predistorter should linearize could change, e.g. due to aging and/or temperature drift. In such a case, a new adjustment of the predistorter could be required or at least desired. In such a case the step S10 and S11 or at least one of the steps are anew performed to adjust to compensate for the change in transfer characteristics. The method then ends.

Figure 16:
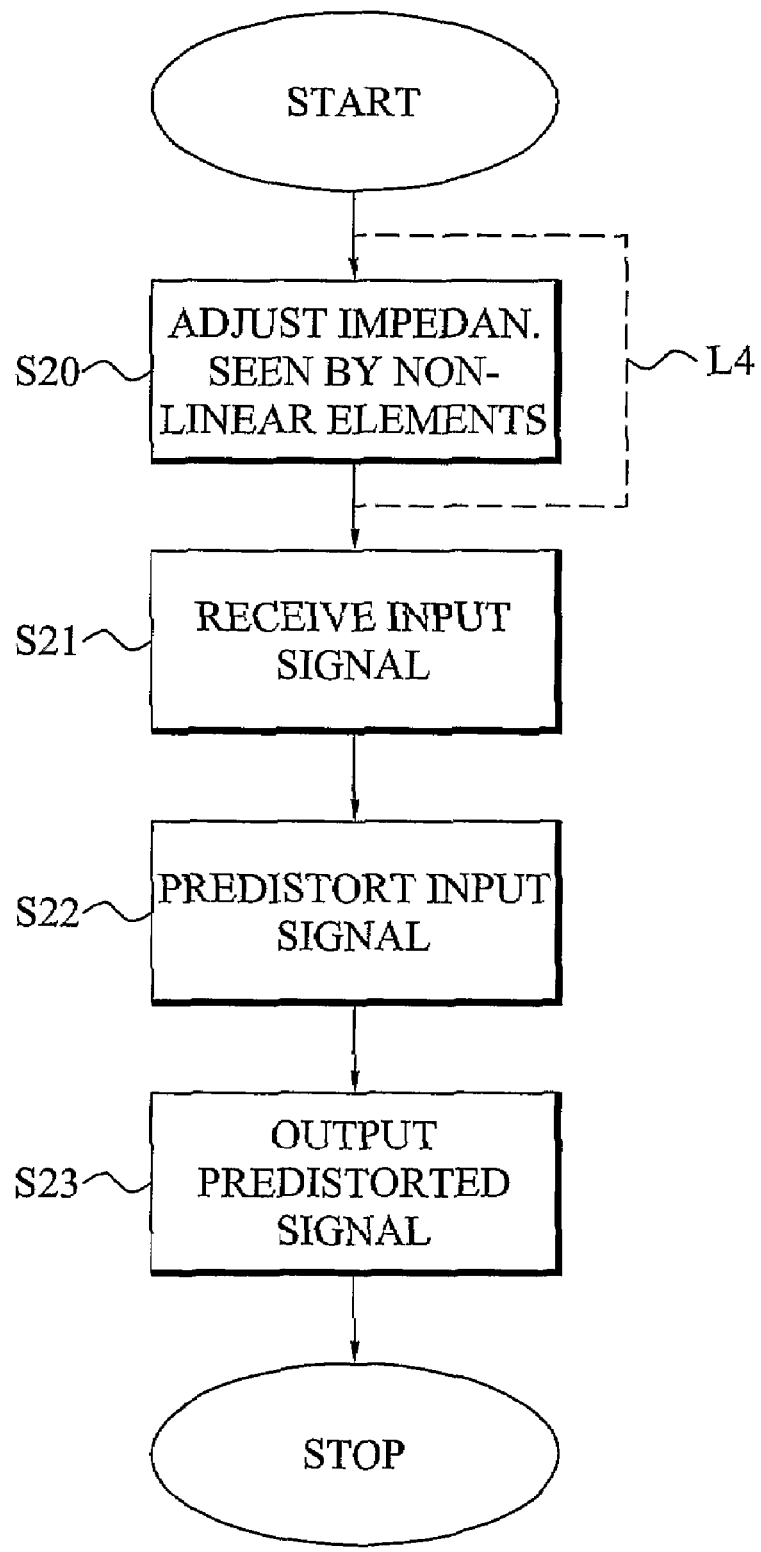
FIG. 16 is a flow diagram illustrating a method of compensating for nonlinear signal variations according to the present invention.

FIG. 16 is a flow diagram illustrating a method of compensating for signal variations caused by at least one nonlinear transfer characteristic according to the present invention. In a first step S20, the compensation characteristics of the predistorter are adjusted to compensate for the nonlinear transfer characteristics. This adjustment of the compensation characteristics is at least partly based on adjusting the impedances seen by the nonlinear circuit elements of the compensation circuits in the predistorter. This step S20 basically corresponds to step S2 of FIG. 13 and is not further discussed.

Once a satisfactory compensation characteristics, above all satisfactory phase and amplitude expansion, has been obtained an input signal, such as an input RF signal, is provided to a coupler of the predistorter in step S21. The predistorter processes the input signal through a first compensation circuit connected to a first coupled port of the coupler and through a second compensation circuit connected to a second coupled port of the coupler in a next step S22. In step S23, the predistorter produces an output signal at the output port based on the processed signals from first and second compensation circuit. This predistorted output signal is then provided to the unit or circuitry, e.g. amplifier, having the nonlinear transfer characteristics. The method ends.

FIG. 17 is a flow diagram illustrating an embodiment of the impedance adjusting step in FIG. 16 in more detail. In a first step S30, biases to the compensation circuits are adjusted. This step basically corresponds to step S10 in FIG. 15 and is not further discussed. In a next step S31, the load impedances seen by the nonlinear circuit elements and, thus, the complex gain expansion of the predistorter are tuned by adjusting biases to the impedance adjusting units. This step basically corresponds to step S12 in FIG. 15 and is not further discussed. The two steps S30 and S31 can be repeated several times, schematically illustrated by the lines L5 and L6. Once a satisfactory compensation characteristic has been obtained the method continues to step S21 of FIG. 16.

It will be understood by a person skilled in the art that various modifications and changes may be made to the present invention without departure from the scope thereof, which is defined by the appended claims.

The invention claimed is:

1. An analog predistorter comprising:
  a coupler having an input port, an output port, a first and a second coupled port separated by 90 degrees;
  a first compensation circuit connected to said first coupled port and comprising:
  a first combination of at least one linear circuit element and a first pair of parallel diodes connected in head-to-head configuration; and
  a first impedance adjusting unit for adjusting an impedance seen by said first pair of parallel diodes of said first circuit element combination;
  a first bias control circuit for controlling a bias level in said first circuit element combination;
  a second compensation circuit connected to said second coupled port and comprising:
  a second combination of linear circuit elements and a second pair of parallel diodes connected in head-to-head configuration nonlinear; and
  a second impedance adjusting unit for adjusting an impedance seen by said second pair of parallel diodes of said second circuit element combination; and
  a second bias control circuit for controlling a bias level in said second circuit element combination.

2. The predistorter according to claim 1, wherein said first and second impedance adjusting unit are operated for tuning a complex gain expansion of said predistorter through the impedance adjustments.

3. The predistorter according to claim 2, wherein said first and second impedance adjusting unit are operated for tuning, through said impedance adjustments, at least one of:
  a phase expansion of said predistorter;
  an amplitude gain expansion of said predistorter.

4. The predistorter according to claim 1, wherein said second compensation circuit comprises identical circuit elements as said first compensation circuit.

5. The predistorter according to claim 1, wherein said first impedance adjusting unit has an adjustable reactance and said second impedance adjusting unit has an adjustable reactance, said reactance of said impedance adjusting units controls the load impedance seen by said first and second pair of parallel diodes.

6. The predistorter according to claim 1, wherein said first impedance adjusting unit has an adjustable capacitance and said second impedance adjusting unit has an adjustable capacitance, said capacitance of said impedance adjusting units controls the load impedance seen by said first and second pair of parallel diodes.

7. The predistorter according to claim 1, wherein said first impedance adjusting unit is operated for electrically adjusting said impedance seen by said first pair of parallel diodes of said first circuit element combination and said second impedance adjusting unit is operated for electrically adjusting said impedance seen by second first pair of parallel diodes of said second circuit element combination.

8. The predistorter according to claim 1, wherein said first impedance adjusting unit comprises a first varicap diode and said second impedance adjusting unit comprises a second varicap diode.

9. The predistorter according to claim 8, wherein said first impedance adjusting unit comprises a first variable voltage source providing a variable direct current, DC, bias to said first varicap diode and said second impedance adjusting unit comprises a second variable voltage source providing a variable DC bias to said second varicap diode.

10. The predistorter according to claim 9, wherein said variable DC biases control the capacitance of said varicap diodes that in turn controls the load impedance seen by said first and second pair of parallel diodes.

11. The predistorter according to claim 1, wherein said first compensation circuit comprises a first DC blocking circuit element arranged between said first impedance varying unit and said first circuit element combination and second compensation circuit comprises a second DC blocking circuit element arranged between said second impedance varying unit and said second circuit element combination.

12. The predistorter according to claim 1, wherein said first compensation circuit comprises said first impedance adjusting unit arranged for adjusting an impedance seen by a first diode of said first diode pair and a third impedance adjusting unit arranged for adjusting an impedance seen by a second diode of said first diode pair and said second compensation circuit comprises said second impedance adjusting unit arranged for adjusting an impedance seen by a first diode of said second diode pair and a fourth impedance adjusting unit arranged for adjusting an impedance seen by a second diode of said second diode pair.

13. The predistorter according to claim 1, wherein said diodes are Schottky diodes.

14. The predistorter according to claim 1, wherein said linear circuit element of said first circuit element combination comprises at least at least one resistor parallel connected to said first pair of parallel diodes of said first circuit element combination and said linear circuit element of said second circuit element combination comprises at least at least one resistor parallel connected to said second pair of parallel diodes of said second circuit element combination.

15. A signal processing unit comprising:
an amplifier for amplifying a signal; and
a predistorter according to claim 1 for compensating for signal variations in said signal caused by a nonlinear transfer characteristic of said amplifier.

16. A transmitter comprising:
an antenna for transmitting a radio frequency signal; and
a signal processing unit according to claim 15 for processing said radio frequency signal input to said antenna.

17. A base station comprising a transmitter according to claim 16.

18. A mobile unit comprising a transmitter according to claim 16.

19. A method of tuning an analog predistorter comprising:
a coupler having an input port, an output port, a first and a second coupled port separated by 90 degrees;
a first compensation circuit connected to said first port and comprising a first combination of at least one linear circuit element and a first pair of parallel diodes connected in head-to-head configuration;
a first bias control circuit for controlling a bias level in said first circuit element combination;
a second compensation circuit connected to said second coupled port and comprising a second combination of at least one linear circuit element and a first pair of parallel diodes connected in head-to-head configuration; and
a second bias control circuit for controlling a bias level in said second circuit element combination, said method comprising the steps of:
adjusting the impedances seen by said first and second pair of parallel diodes of said first and second compensation circuit, wherein the impedance adjustments tune a complex gain expansion of said predistorter; and
adjusting the bias level in said first compensation circuit and said second compensation circuit, wherein said bias levels control an initiation power level of said complex gain expansion of said predistorter.

20. A method of compensating for signal variations caused by at least one nonlinear transfer characteristic, said method comprising the steps of:
directing an input signal through a coupler of an analog predistorter, said coupler having an input port, an output port and a first and a second coupled port separated by 90 degrees;
processing said input signal through a first compensation circuit of said predistorter connected to said first coupled port and comprising a first combination of at least one linear circuit element and a first pair of parallel diodes connected in head-to-head configuration and through a second compensation circuit of said predistorter connected to said second coupled port and comprising a second combination of at least one linear circuit element and a second pair of parallel diodes connected in head-to-head configuration;
generating an output signal at said output port based on said processed input signal;
adjusting the impedances seen by said first and second pair of parallel diodes, wherein the impedance adjustments tune a complex gain expansion of said predistorter to compensate for said signal variations; and
adjusting the bias level in said first compensation circuit and said second compensation circuit, wherein said bias levels control an initiation power level of said complex gain expansion of said predistorter.

21. The method according to claim 19, wherein said impedance adjustments tune at least one of:
a phase expansion of said predistorter;
an amplitude gain expansion of said predistorter.

22. The method according to claim 19, wherein said predistorter comprises a first impedance adjusting unit for adjusting the impedance seen by said first pair of parallel diodes of said first compensation circuit and a second impedance adjusting unit for adjusting the impedance seen by said second pair of parallel diodes of said second compensation circuit and said adjusting step comprises adjusting the capacitances of said first and second impedance adjusting unit, which adjust the load impedances seen by said first and second pair of parallel diodes that in turn tune said complex gain expansion of said predistorter.

23. The method according to claim 19, wherein said adjusting step comprises electrically adjusting said impedances seen by said first and second pair of parallel diodes.

24. The method according to claim 23, wherein each of said first and second compensation circuit comprises a varicap diode and said adjusting step comprises adjusting direct current, DC, biases to said varicap diodes, said DC biases control the capacitance of said varicap diodes, which controls the load impedances seen by said first and second pair of parallel diodes that in turn tune said complex gain expansion of said predistorter.

* * * * *